United States Patent
Wu et al.

(10) Patent No.: US 12,243,918 B2
(45) Date of Patent: Mar. 4, 2025

(54) SEMICONDUCTOR DEVICE WITH DIELECTRIC LINERS ON GATE REFILL METAL

(71) Applicant: TAIWAN SEMICONDUCTOR MANUFACTURING COMPANY, LTD., Hsinchu (TW)

(72) Inventors: Yuan-Hsiang Wu, Changhua County (TW); Jia-Chuan You, Taoyuan (TW); Chia-Hao Chang, Hsinchu (TW); Kuo-Cheng Chiang, Hsinchu County (TW); Chih-Hao Wang, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 447 days.

(21) Appl. No.: 17/837,613

(22) Filed: Jun. 10, 2022

(65) Prior Publication Data
US 2023/0402512 A1    Dec. 14, 2023

(51) Int. Cl.
| | |
|---|---|
| H01L 29/423 | (2006.01) |
| H01L 21/02 | (2006.01) |
| H01L 29/06 | (2006.01) |
| H01L 29/40 | (2006.01) |
| H01L 29/417 | (2006.01) |
| H01L 29/66 | (2006.01) |
| H01L 29/775 | (2006.01) |
| H01L 29/786 | (2006.01) |
| H01L 21/8234 | (2006.01) |

(52) U.S. Cl.
CPC ...... *H01L 29/401* (2013.01); *H01L 21/02603* (2013.01); *H01L 29/0673* (2013.01); *H01L 29/41733* (2013.01); *H01L 29/42392* (2013.01); *H01L 29/66439* (2013.01); *H01L 29/66742* (2013.01); *H01L 29/775* (2013.01); *H01L 29/78696* (2013.01); *H01L 21/823437* (2013.01); *H01L 21/823481* (2013.01); *H01L 29/6656* (2013.01)

(58) Field of Classification Search
CPC .......... H01L 21/02603; H01L 29/0673; H01L 29/42392; H01L 29/66742; H01L 29/775; H01L 29/78696; H01L 21/823437; H01L 21/823481; H01L 29/6656
See application file for complete search history.

(56) References Cited

U.S. PATENT DOCUMENTS

| | | |
|---|---|---|
| 9,209,247 B2 | 12/2015 | Colinge et al. |
| 9,236,267 B2 | 1/2016 | De et al. |
| (Continued) | | |

*Primary Examiner* — David Vu
*Assistant Examiner* — Brandon C Fox
(74) *Attorney, Agent, or Firm* — Maschoff Brennan

(57) ABSTRACT

A device includes a gate structure, first and second gate spacers, source/drain regions, a refill metal structure, and a first dielectric liner. The gate structure is on a substrate. The first and second gate spacers are on opposite sides of the gate structure, respectively. The source/drain regions are spaced part from the gate structure at least in part by the first and second gate spacers. The refill metal structure is on the gate structure and between the first and second gate spacers. The first di electric liner is atop the gate structure. The first dielectric liner interposes the refill metal structure and the first gate spacer.

20 Claims, 32 Drawing Sheets

(56) References Cited

U.S. PATENT DOCUMENTS

| | | |
|---|---|---|
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 2022/0399335 A1* | 12/2022 | Guler ................ H01L 29/41791 |
| 2024/0096886 A1* | 3/2024 | Cheng ............ H01L 21/823807 |

* cited by examiner

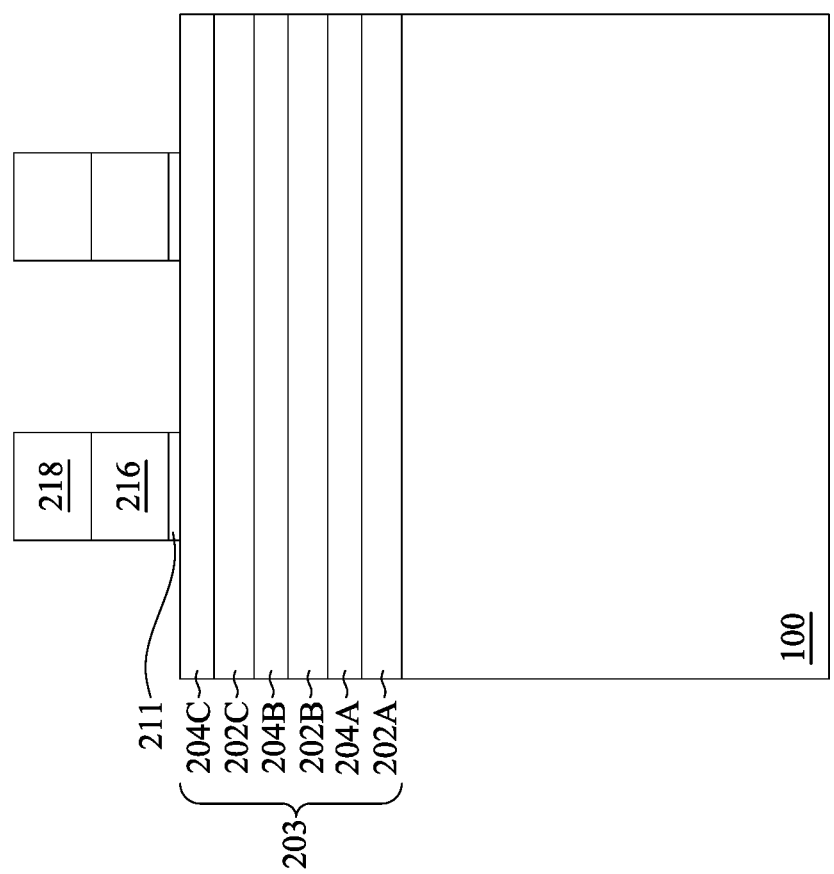

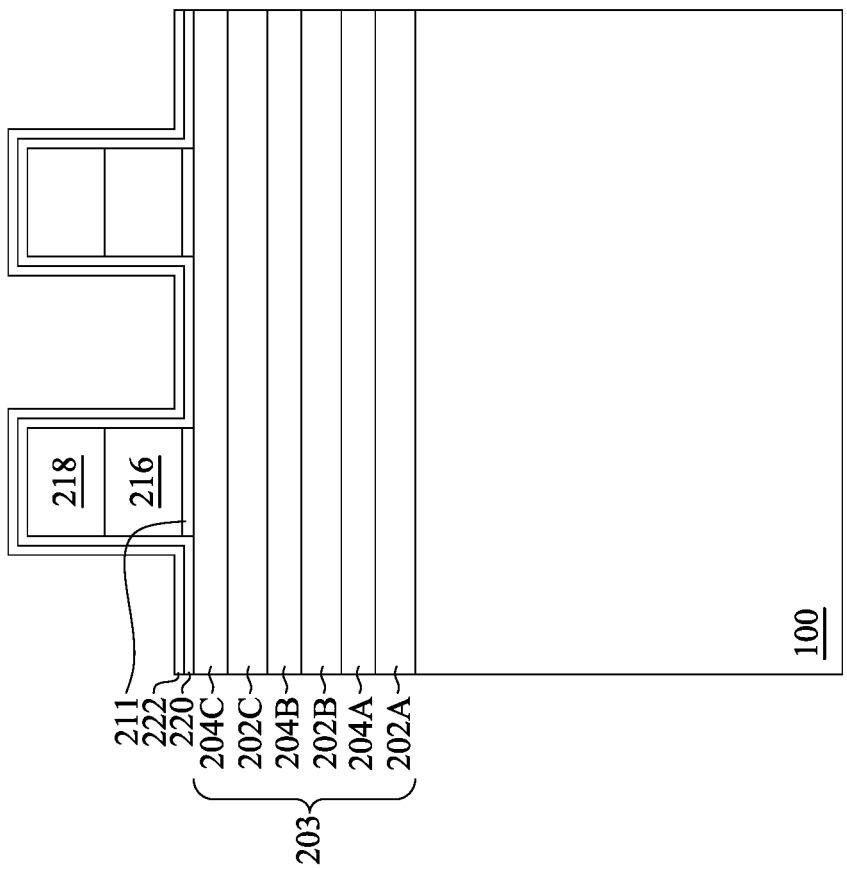
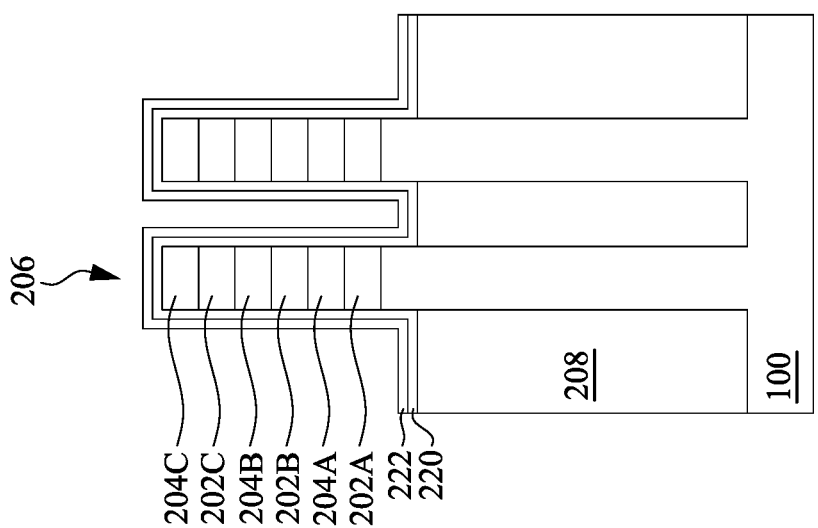
Fig. 7B
Fig. 7A

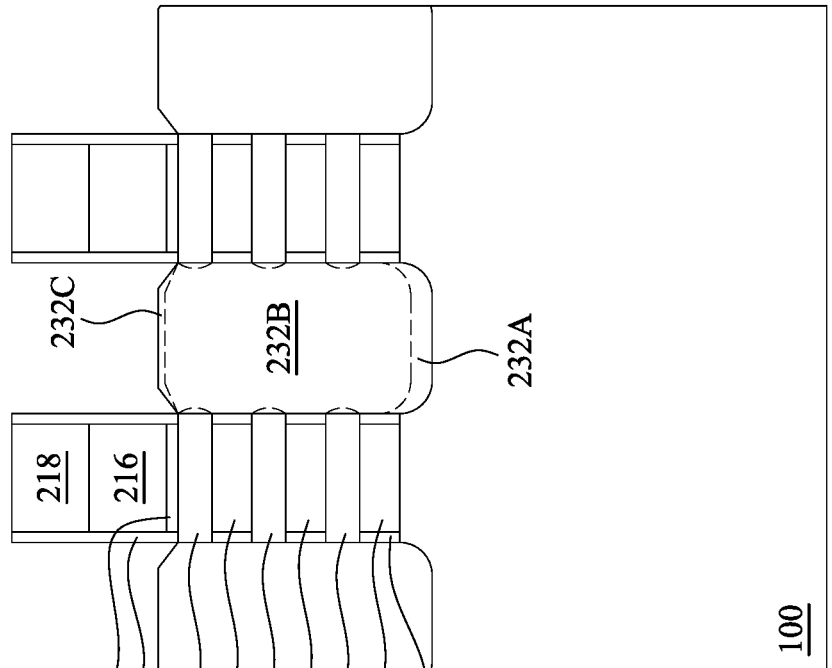
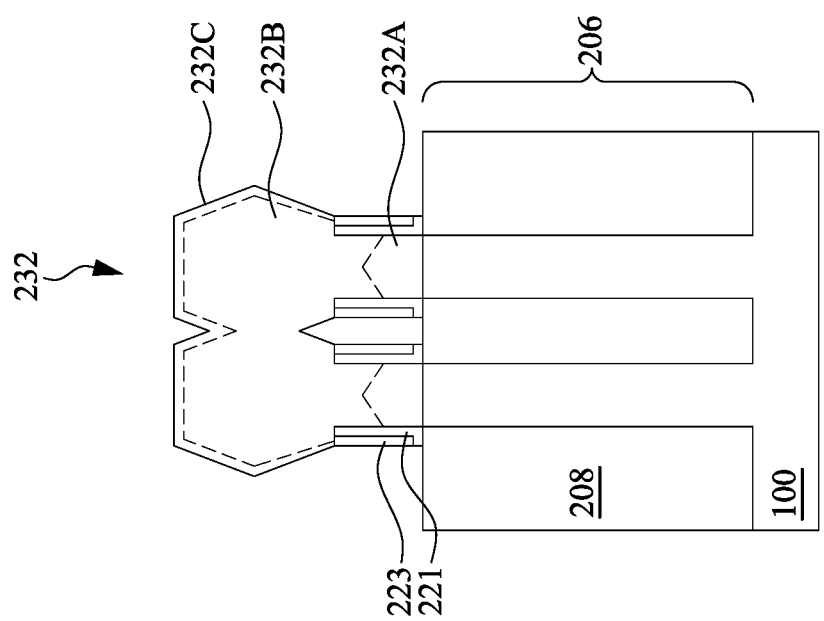
Fig. 12B
Fig. 12A

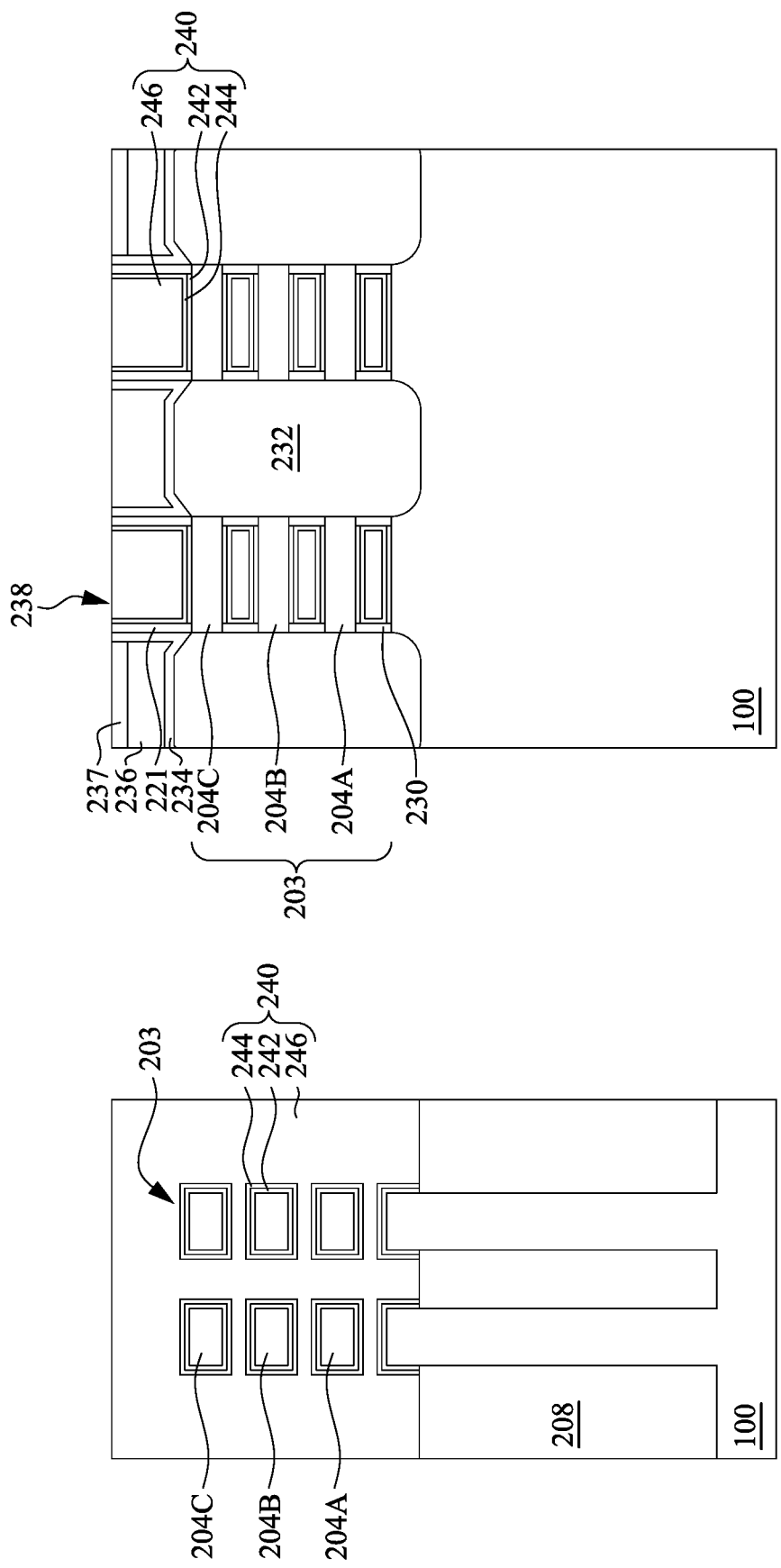

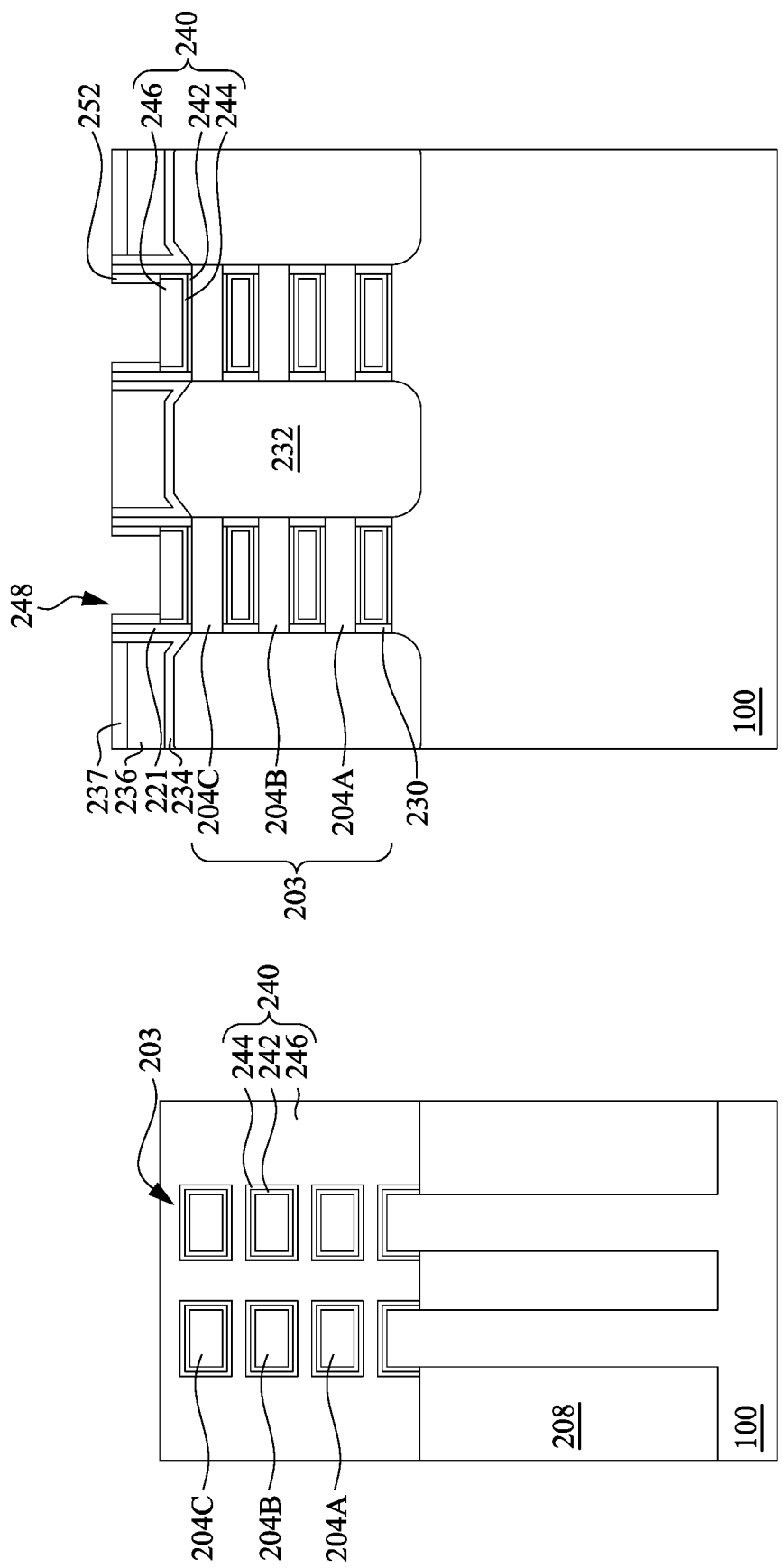

SEMICONDUCTOR DEVICE WITH DIELECTRIC LINERS ON GATE REFILL METAL

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2 through 5, 6A, 13A, 14A, 15A, 16A, 17A, 18A, 19A, 20A, 21A, and 22A illustrate reference cross-section A-A' illustrated in FIG. 1 that extends through a gate region along a longitudinal axis of the gate region.

FIGS. 6B, 7B, 8B, 9B, 10B, 11B, 11C, 12B, 12D, 13B, 14B, 15B, 16B, 17B, 18B, 19B, 20B, 21B, 22B, 24C, and 25A illustrate reference cross-section B-B' illustrated in FIG. 1 that extends through a fin along a longitudinal axis of the fin.

FIGS. 7A, 8A, 9A, 10A, 11A, 12A, 12C, and 13C illustrate reference cross-section C-C' illustrated in FIG. 1 that extends through source/drain regions along the longitudinal direction of the gate region.

DETAILED DESCRIPTION

Figure 1:
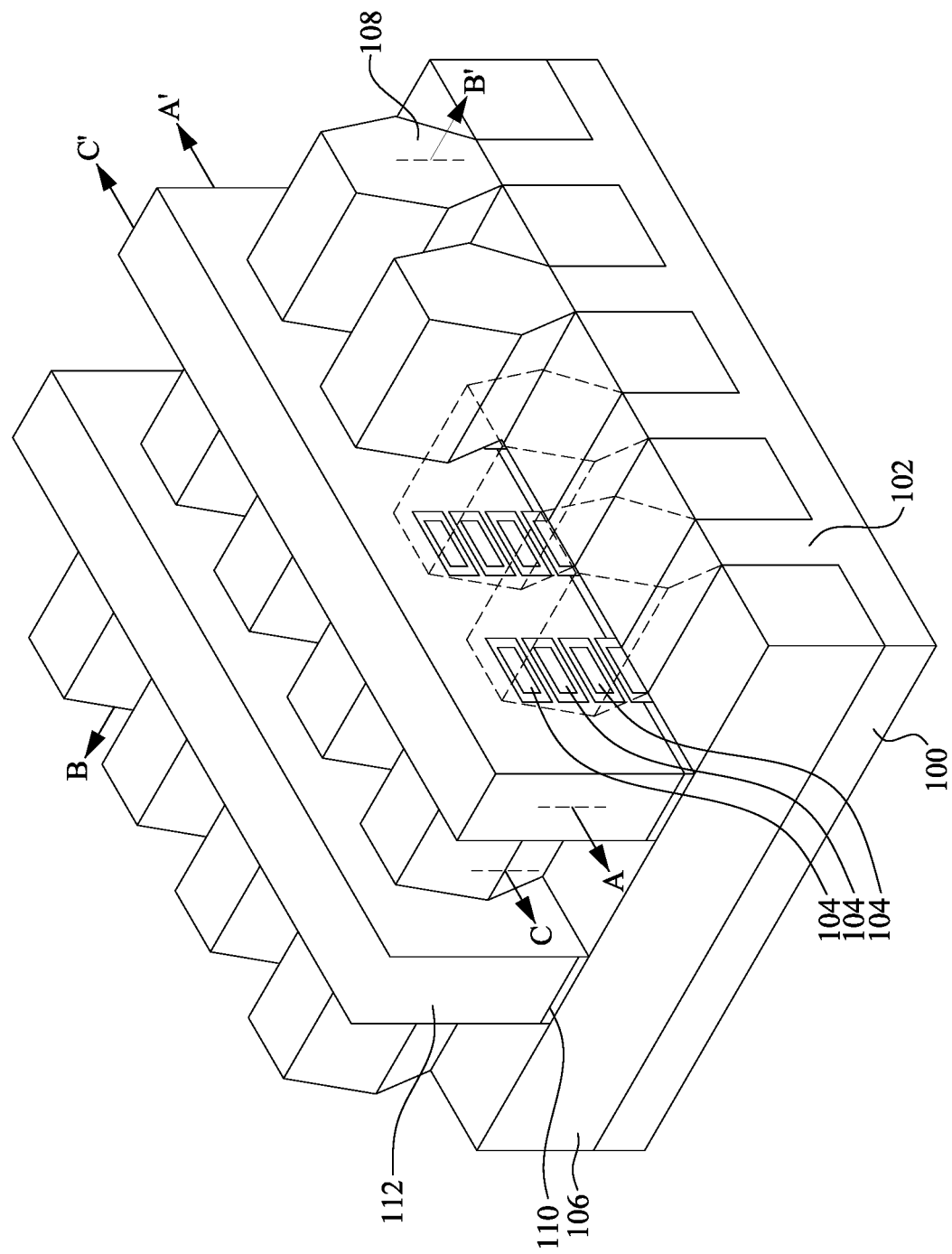
FIG. 1 illustrates an example of gate-all-around field-effect transistors (GAA-FETs) in a three-dimensional view, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 230 degrees or at other orientations) and the spatially relative descriptors used herein may likewise be interpreted accordingly. As used herein, "around," "about," "approximately," or "substantially" may generally mean within 20 percent, or within 10 percent, or within 5 percent of a given value or range. Numerical quantities given herein are approximate, meaning that the term "around," "about," "approximately," or "substantially" can be inferred if not expressly stated.

The present disclosure is generally related to integrated circuit (IC) structures and methods of forming the same, and more particularly to fabricating gate-all-around (GAA) transistors. It is also noted that the present disclosure presents embodiments in the form of multi-gate transistors. Multi-gate transistors include those transistors whose gate structures are formed on at least two-sides of a channel region. These multi-gate devices may include a p-type metal-oxide-semiconductor device or an n-type metal-oxide-semiconductor device. Specific examples may be presented and referred to herein as FinFET, on account of their fin-like structure. Also presented herein are embodiments of a type of multi-gate transistor referred to as a gate-all-around (GAA) device. A GAA device includes any device that has its gate structure, or portion thereof, formed on 4-sides of a channel region (e.g., surrounding a portion of a channel region). Devices presented herein also include embodiments that have channel regions disposed in nanosheet channel(s), nanowire channel(s), and/or other suitable channel configuration. Presented herein are embodiments of devices that may have one or more channel regions (e.g., nanosheets) associated with a single, contiguous gate structure. However, one of ordinary skill would recognize that the teaching can apply to a single channel (e.g., single nanosheet) or any number of channels. One of ordinary skill may recognize other examples of semiconductor devices that may benefit from aspects of the present disclosure.

As scales of the fin width in fin field effect transistors (FinFET) decreases, channel width variations might cause mobility loss. GAA transistors, such as nanosheet transistors are being studied as an alternative to fin field effect transistors. In a nanosheet transistor, the gate of the transistor is made all around the channel (e.g., a nanosheet channel or a nanowire channel) such that the channel is surrounded or encapsulated by the gate. Such a transistor has the advantage of improving the electrostatic control of the channel by the gate, which also mitigates leakage currents.

In order to shorten the gate-to-gate pitch for further increasing device density (e.g., amount of GAA transistors per given area), gate spacers with reduced thickness are formed on either side of the gate. However, reduction in the spacer thickness may cause increased risk of isolation breakdown between the metal gate (MG) and source/drain contact (also called metal on diffusion (MD)). Therefore, the present disclosure provides, in various embodiments, an additional dielectric liner formed before forming a gate refill metal on the metal gate, which in turn increases a distance from the gate refill metal to the source/drain contact, thus reducing the isolation breakdown risk.

FIG. 1 illustrates an example of GAA-FETs (e.g., nanowire FETs, nanosheet FETs, or the like) in a three-dimensional view, in accordance with some embodiments. The GAA-FETs comprise nanostructures 104 (e.g., nanosheets, nanowires, nanorings, nanoslabs, or other structures having nanoscale size (e.g., a few nanometers)) over fins 102 on a substrate 100 (e.g., a semiconductor substrate), wherein the nanostructures 104 act as channel regions for the GAA-FETs. The nanostructure 104 may include p-type nanostructures, n-type nanostructures, or a combination thereof. Isolation regions 106 are disposed between adjacent fins 102, which may protrude above and from between neighboring isolation regions 106. Although the isolation regions 106 are described/illustrated as being separate from the substrate 100, as used herein, the term "substrate" may refer to the semiconductor substrate alone or a combination of the semiconductor substrate and the isolation regions. Additionally, although a bottom portion of the fins 102 are illustrated as being single, continuous materials with the substrate 100, the bottom portion of the fins 102 and/or the substrate 100 may comprise a single material or a plurality of materials. In this context, the fins 102 refer to the portion extending between the neighboring isolation regions 106.

Gate dielectrics 110 are over top surfaces of the fins 102 and along top surfaces, sidewalls, and bottom surfaces of the nanostructures 104. Gate electrodes 112 are over the gate dielectrics 110. Epitaxial source/drain regions 108 are disposed on the fins 102 on opposing sides of the gate dielectric layers 110 and the gate electrodes 112.

FIG. 1 further illustrates reference cross-sections that are used in later figures. Cross-section A-A' is along a longitudinal axis of a gate electrode 112 and in a direction, for example, perpendicular to the direction of current flow between the epitaxial source/drain regions 108 of a GAA-FET. Cross-section B-B' is perpendicular to cross-section A-A' and is parallel to a longitudinal axis of a fin 102 in the GAA-FET and in a direction of, for example, a current flow between the epitaxial source/drain regions 108 of the GAA-FET. Cross-section C-C' is parallel to cross-section A-A' and extends through epitaxial source/drain regions of the GAA-FETs. Subsequent figures refer to these reference cross-sections for clarity.

Some embodiments discussed herein are discussed in the context of GAA-FETs formed using a gate-last process. In other embodiments, a gate-first process may be used. Also, some embodiments contemplate aspects used in planar devices, such as planar FETs or in fin field-effect transistors (FinFETs).

Figure 23:
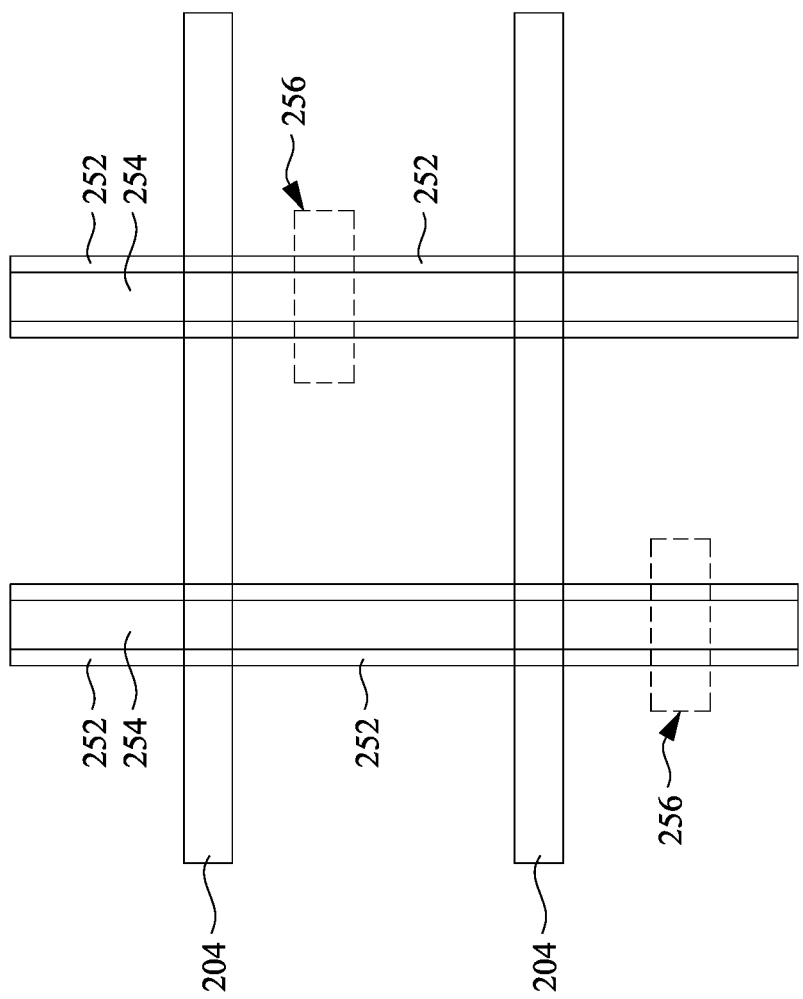
FIGS. 23 and 24A illustrate top views of GAA-FETs in gate cut processing in accordance with some embodiments of the present disclosure.
Figure 24A:
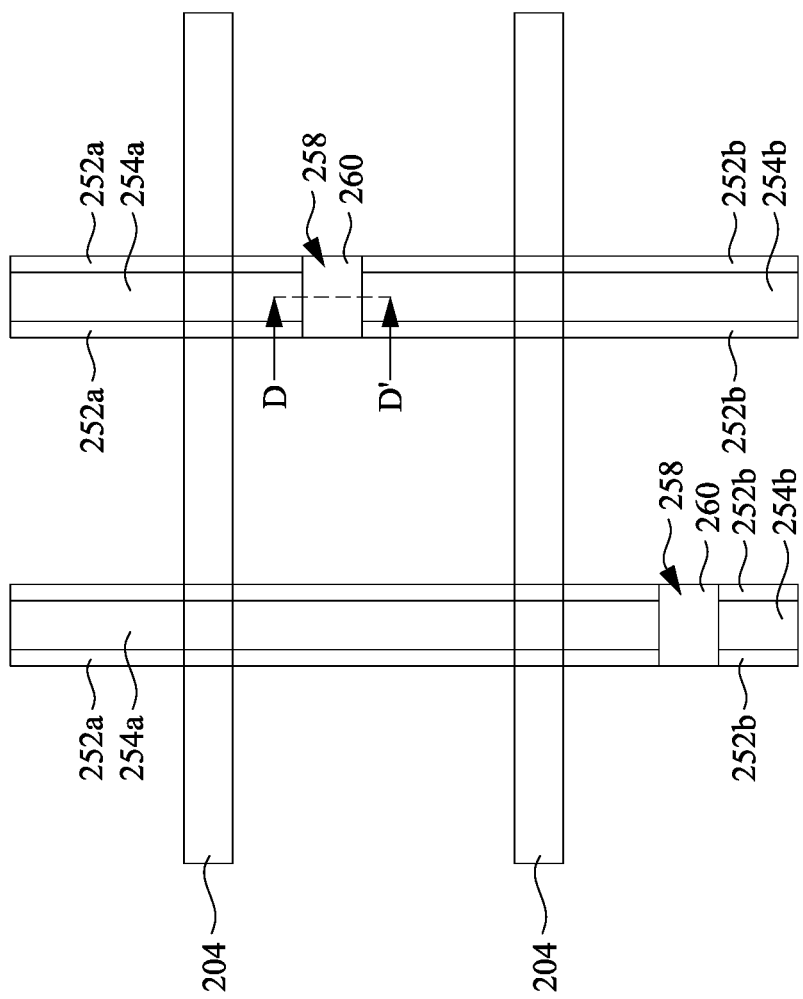

FIGS. 2 through 25B are cross-sectional views and top views of intermediate stages in the manufacturing of GAA-FETs, in accordance with some embodiments. FIGS. 2 through 5, 6A, 13A, 14A, 15A, 16A, 17A, 18A, 19A, 20A, 21A, and 22A illustrate reference cross-section A-A' illustrated in FIG. 1 that extends through a gate region along a longitudinal axis of the gate region. FIGS. 6B, 7B, 8B, 9B, 10B, 11B, 11C, 12B, 12D, 13B, 14B, 15B, 16B, 17B, 18B, 19B, 20B, 21B, 22B, 24C, and 25A illustrate reference cross-section B-B' illustrated in FIG. 1 that extends through a fin along a longitudinal axis of the fin. FIGS. 7A, 8A, 9A, 10A, 11A, 12A, 12C, and 13C illustrate reference cross-section C-C' illustrated in FIG. 1 that extends through source/drain regions along the longitudinal direction of the gate region. FIGS. 23 and 24A illustrate top views of GAA-FETs in gate cut processing. FIG. 24B illustrates reference cross-section D-D' illustrated in FIG. 24A.

Figure 2:
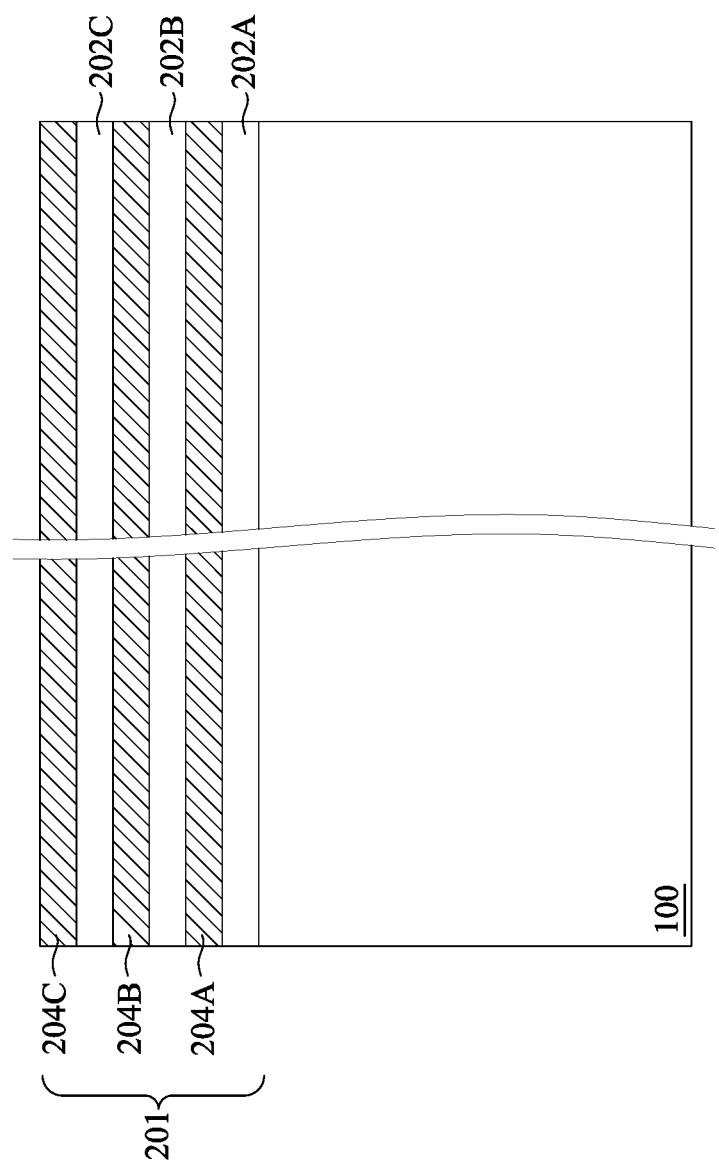

In FIG. 2, a substrate 100 is provided. The substrate 100 may be a semiconductor substrate, such as a bulk semiconductor, a semiconductor-on-insulator (SOI) substrate, or the like, which may be doped (e.g., with a p-type or an n-type dopant) or undoped. The substrate 100 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 100 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

Further in FIG. 2, a multi-layer stack 201 is formed over the substrate 100. The multi-layer stack 201 includes alternating layers of first semiconductor layers 202A-C (collectively referred to as first semiconductor layers 202) and second semiconductor layers 204A-C (collectively referred to as second semiconductor layers 204). For purposes of illustration and as discussed in greater detail below, the first semiconductor layers 202 will be removed and the second semiconductor layers 204 will be patterned to form channel regions of GAA-FETs.

The multi-layer stack 201 is illustrated as including three layers of each of the first semiconductor layers 202 and the second semiconductor layers 204 for illustrative purposes. In some embodiments, the multi-layer stack 201 may include any number of the first semiconductor layers 202 and the second semiconductor layers 204. Each of the layers of the multi-layer stack 201 may be epitaxially grown using a process such as chemical vapor deposition (CVD), atomic layer deposition (ALD), vapor phase epitaxy (VPE), molecular beam epitaxy (MBE), or the like. In various embodiments, the second semiconductor layers 204 may be formed of a semiconductor material suitable for serving as channel regions of GAA-FETs, such as silicon, silicon carbon, silicon germanium, or the like.

The first semiconductor materials and the second semiconductor materials may be materials having a high-etch selectivity to one another. As such, the first semiconductor layers 202 of the first semiconductor material may be removed without significantly removing the second semiconductor layers 204 of the second semiconductor material, thereby allowing the second semiconductor layers 204 to serve as channel regions of GAA-FETs.

Figure 3:
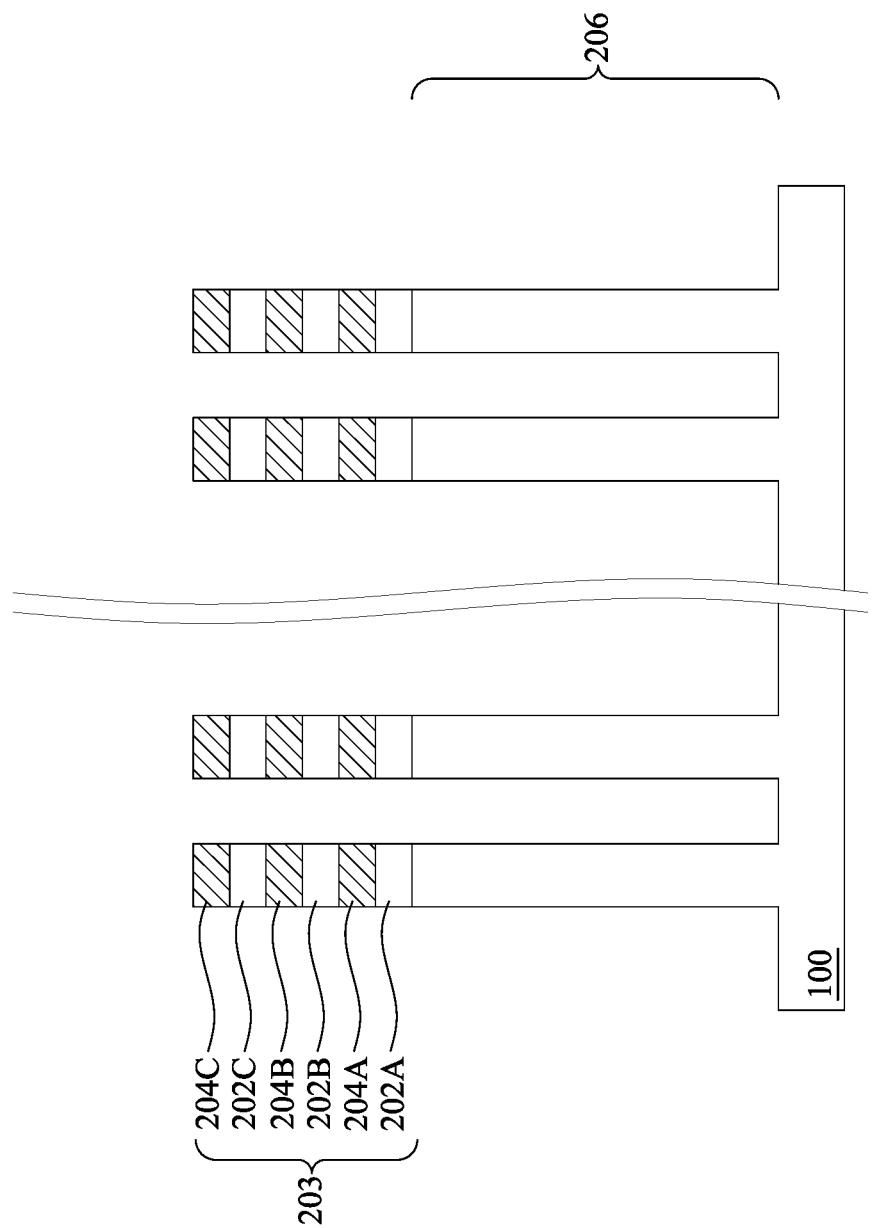

Referring now to FIG. 3, fin structures 206 are formed in the substrate 100 and nanostructures 203 are formed in the multi-layer stack 201, in accordance with some embodiments. In some embodiments, the nanostructures 203 and the fin structures 206 may be formed in the multi-layer stack 201 and the substrate 100, respectively, by etching trenches in the multi-layer stack 201 and the substrate 100. Each fin structure 206 and overlying nanostructures 230 can be collectively referred to as a semiconductor fin extending from the substrate 100. The etching may be any acceptable etch process, such as a reactive ion etch (RIE), neutral beam etch (NBE), the like, or a combination thereof. The etching may be anisotropic. Forming the nanostructures 203 by etching the multi-layer stack 201 may further define first nanostructures 202A-C (collectively referred to as the first nanostructures 202) from the first semiconductor layers 202 and define second nanostructures 204A-C (collectively referred to as the second nanostructures 204) from the second semiconductor layers 204. The first nanostructures 202 and the second nanostructures 204 may further be collectively referred to as nanostructures 203.

The fin structures 206 and the nanostructures 203 may be patterned by any suitable method. For example, the fin structures 206 and the nanostructures 203 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures 206. While each of the fin structures 206 and the nanostructures 203 are illustrated as having a consistent width throughout, in other embodiments, the fin structures 206 and/or the nanostructures 203 may have tapered sidewalls such that a width of each of the fin structures 206 and/or the nanostructures 203 continuously increases in a direction towards the substrate 100. In such embodiments, each of the nanostructures 203 may have a different width and be trapezoidal in shape.

Figure 4:
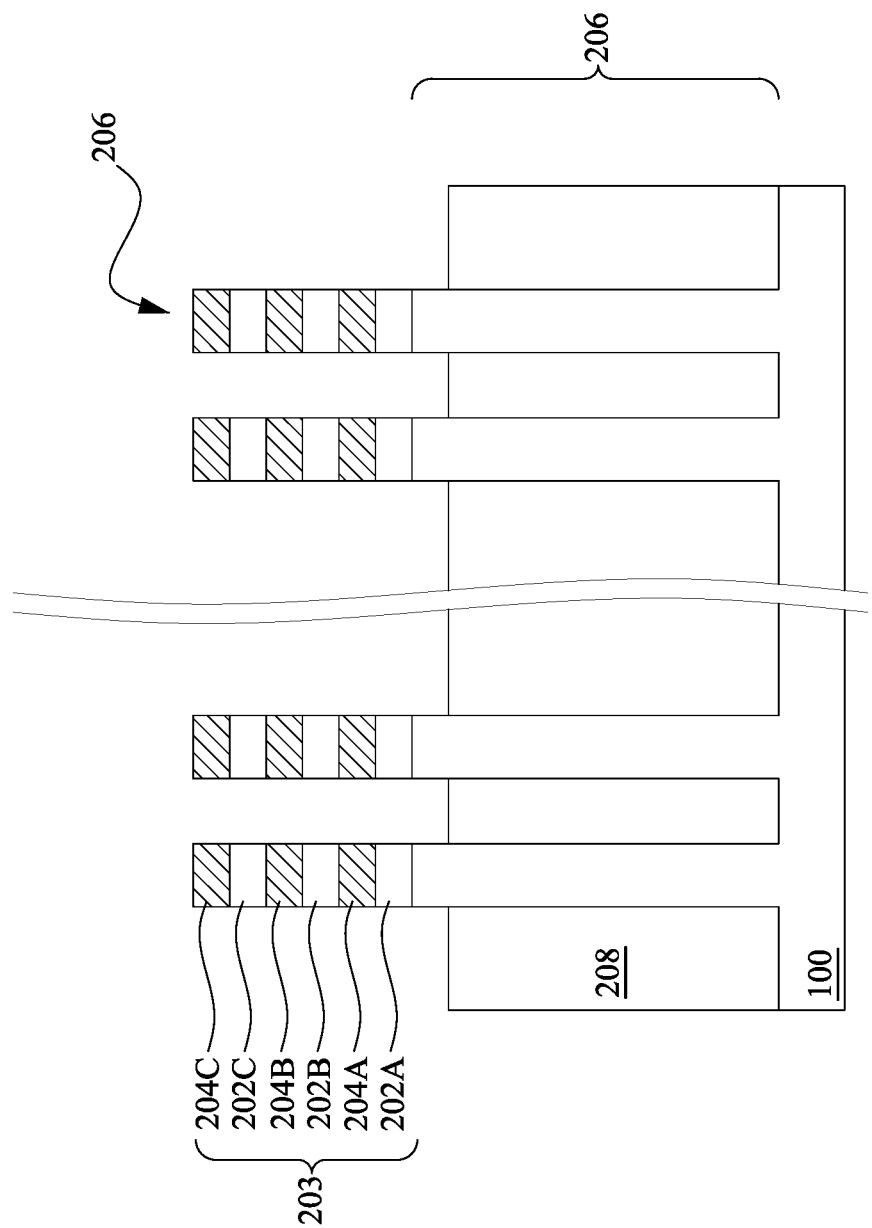

In FIG. 4, shallow trench isolation (STI) regions 208 are formed adjacent the fin structures 206. The STI regions 208 may be formed by depositing an insulation material over the substrate 100, the fin structures 206, and nanostructures 203, and between adjacent fin structures 206. The insulation material may be an oxide, such as silicon oxide, a nitride, the like, or a combination thereof, and may be formed by high-density plasma CVD (HDP-CVD), flowable CVD (FCVD), the like, or a combination thereof. Other insulation materials formed by any acceptable process may be used. In the illustrated embodiment, the insulation material is silicon oxide formed by an FCVD process. An anneal process may be performed once the insulation material is formed. In an embodiment, the insulation material is formed such that excess insulation material covers the nanostructures 203. Although the insulation material is illustrated as a single layer, some embodiments may utilize multiple layers. For example, in some embodiments a liner (not separately illustrated) may first be formed along a surface of the substrate 100, the fin structures 206, and the nanostructures 203. Thereafter, a fill material, such as those discussed above may be formed over the liner.

A removal process is then applied to the insulation material to remove excess insulation material over the nanostructures 203. In some embodiments, a planarization process such as a chemical mechanical polish (CMP), an etch-back process, combinations thereof, or the like may be utilized. The planarization process exposes the nanostructures 203 such that top surfaces of the nanostructures 203 and the insulation material are level after the planarization process is complete.

The insulation material is then recessed to form the STI regions 208. The insulation material is recessed such that upper portions of fin structures 206 protrude from between neighboring STI regions 208. Further, the top surfaces of the STI regions 208 may have a flat surface as illustrated, a convex surface, a concave surface (such as dishing), or a combination thereof. The top surfaces of the STI regions 208 may be formed flat, convex, and/or concave by an appropriate etch. The STI regions 208 may be recessed using an acceptable etching process, such as one that is selective to the material of the insulation material (e.g., etches the material of the insulation material at a faster rate than the material of the fin structures 206 and the nanostructures 203). For example, an oxide removal using, for example, dilute hydrofluoric (dHF) acid may be used.

The process described above with respect to FIGS. 2 through 4 is just one example of how the fin structures 206 and the nanostructures 203 may be formed. In some embodiments, the fin structures 206 and/or the nanostructures 203 may be formed using a mask and an epitaxial growth process. For example, a dielectric layer can be formed over a top surface of the substrate 100, and trenches can be etched through the dielectric layer to expose the underlying substrate 100. Epitaxial structures can be epitaxially grown in the trenches, and the dielectric layer can be recessed such that the epitaxial structures protrude from the dielectric layer to form the fin structures 206 and/or the nanostructures 203. The epitaxial structures may comprise the alternating semiconductor materials discussed above, such as the first semiconductor materials and the second semiconductor materials. In some embodiments where epitaxial structures are epitaxially grown, the epitaxially grown materials may be in situ doped during growth, which may obviate prior and/or subsequent implantations, although in situ and implantation doping may be used together.

Further in FIG. 4, appropriate wells (not separately illustrated) may be formed in the fin structures 206 and/or the nanostructures 203. In some embodiments with different well types in different device regions (e.g., NFET region and PFET region), different implant steps may be achieved using a photoresist or other masks (not separately illustrated). For example, a photoresist may be formed over the fin structures 206 and the STI regions 208 in the NFET region and the PFET region. The photoresist is patterned to expose the PFET region. The photoresist can be formed by using a spin-on technique and can be patterned using acceptable photolithography techniques. Once the photoresist is patterned, a first impurity (e.g., n-type impurity such as phosphorus, arsenic, antimony, or the like) implant is performed in the PFET region, and the photoresist may act as a mask to substantially prevent the first impurities from being implanted into the NFET region. After the implant, the photoresist is removed, such as by an acceptable ashing process.

Following or prior to the implanting of the PFET region, a photoresist or other masks (not separately illustrated) is formed over the fin structures 206, the nanostructures 203, and the STI regions 208 in the NFET region and the PFET region. The photoresist is then patterned to expose the NFET region. The photoresist can be formed by using a spin-on technique and can be patterned using acceptable photolithography techniques. Once the photoresist is patterned, a second impurity (e.g., p-type impurity such as boron, boron fluoride, indium, or the like) implant may be performed in the NFET region, and the photoresist may act as a mask to substantially prevent p-type impurities from being implanted into the PFET region. After the implant, the photoresist may be removed, such as by an acceptable ashing process.

After one or more well implants of the NFET region and PFET region, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 5:
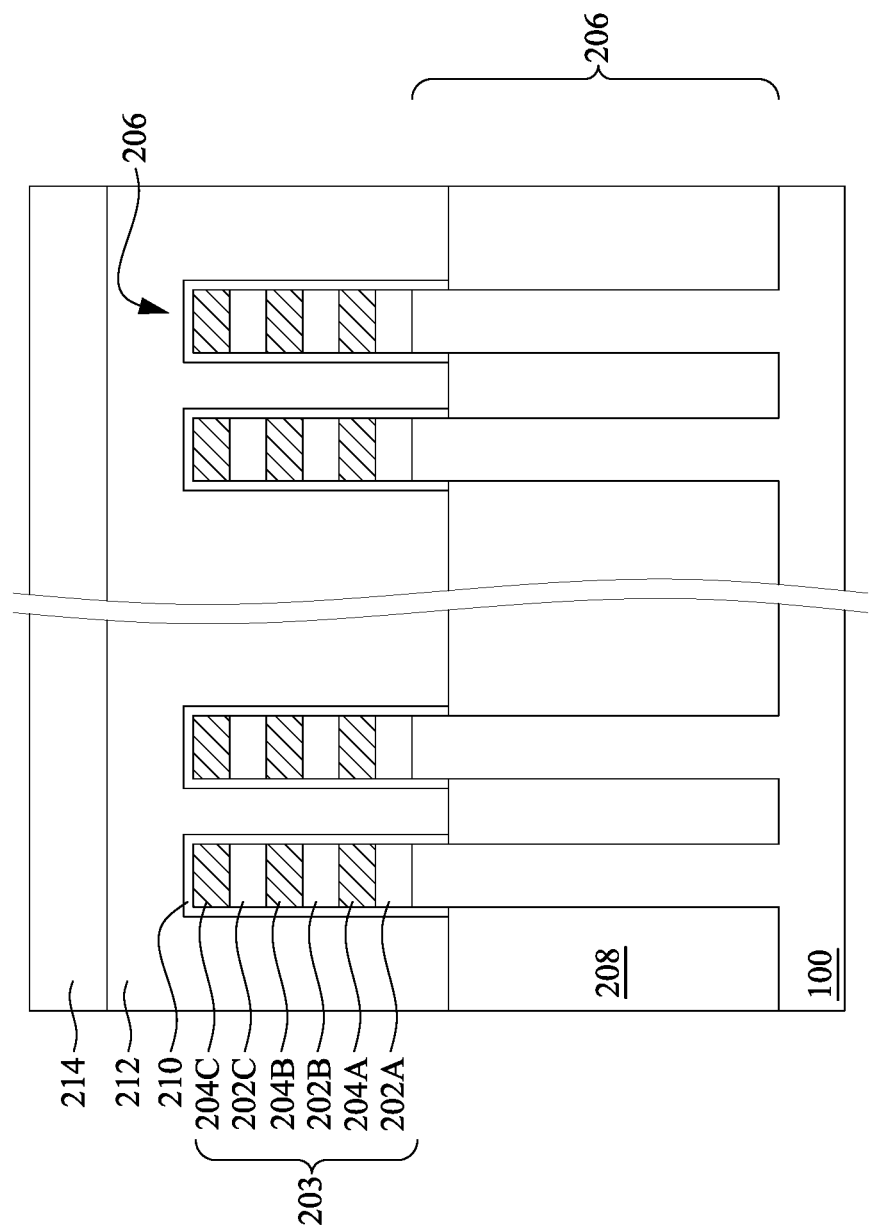

In FIG. 5, a dummy dielectric layer 210 is formed on the fin structures 206 and/or the nanostructures 203. The dummy dielectric layer 210 may be, for example, silicon oxide, silicon nitride, a combination thereof, or the like, and may be deposited or thermally grown according to acceptable techniques. A dummy gate layer 212 is formed over the dummy dielectric layer 210, and a mask layer 214 is formed over the dummy gate layer 212. The dummy gate layer 212 may be deposited over the dummy dielectric layer 210 and then planarized, such as by a CMP. The mask layer 214 may be deposited over the dummy gate layer 212. The dummy gate layer 212 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 212 may be deposited by physical vapor deposition (PVD), CVD, sputter deposition, or other techniques for depositing the selected material. The dummy gate layer 212 may be made of other materials that have a high etching selectivity from the etching of isolation regions. The mask layer 214 may include, for example, silicon nitride, silicon oxynitride, or the like. It is noted that the dummy dielectric layer 210 is shown covering only the fin structures 206 and the nanostructures 203 for illustrative purposes only. In some embodiments, the dummy dielectric layer 210 may be deposited such that the dummy dielectric layer 210 covers the STI regions 208, such that the dummy dielectric layer 210 extends between the dummy gate layer 212 and the STI regions 208.

Figure 6A:
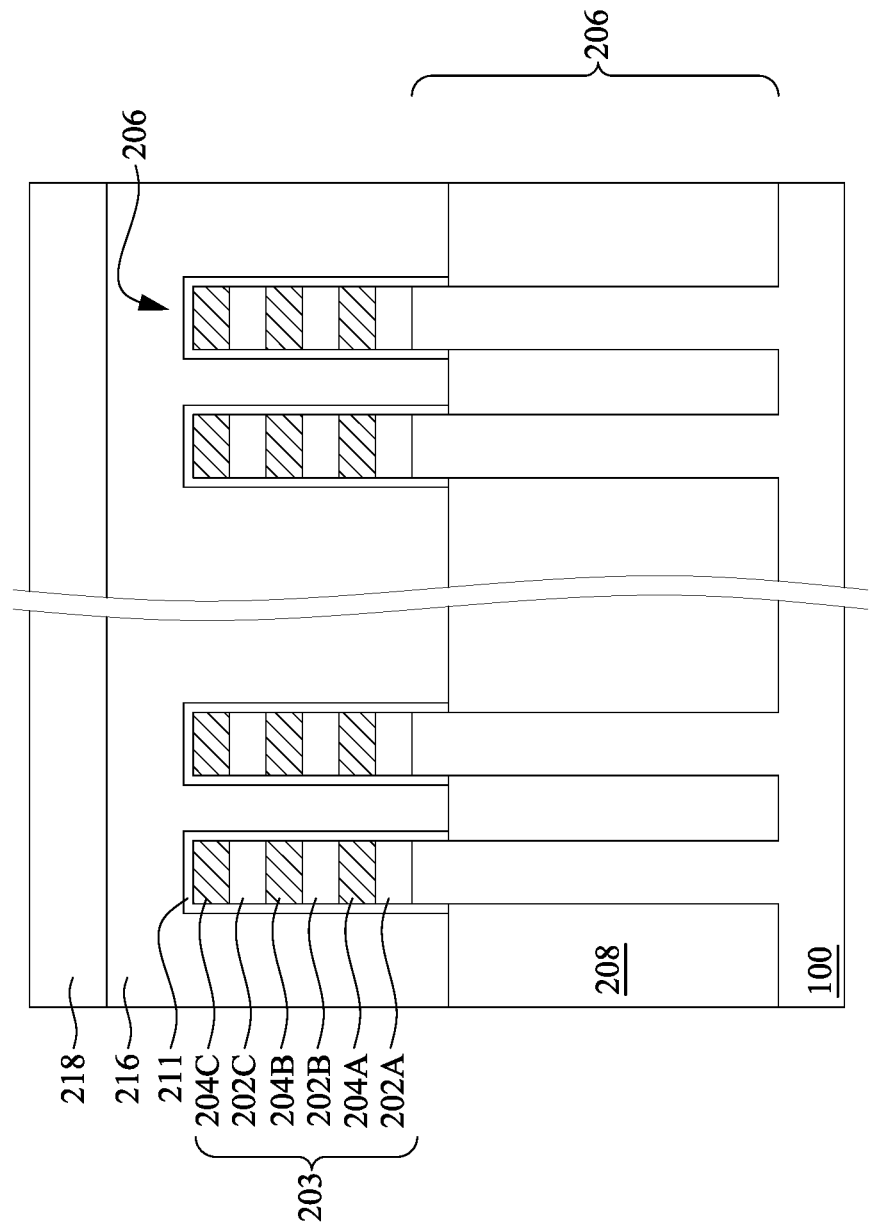

In FIGS. 6A and 6B, the mask layer 214 (see FIG. 5) may be patterned using acceptable photolithography and etching techniques to form masks 218. The pattern of the masks 218 then may be transferred to the dummy gate layer 212 and to the dummy dielectric layer 210 to form dummy gates 216 and dummy gate dielectrics 211, respectively. The dummy gates 216 cover respective channel regions of the fin structures 206. The pattern of the masks 218 may be used to physically separate each of the dummy gates 216 from adjacent dummy gates 216. The dummy gates 216 may also have a lengthwise direction substantially perpendicular to the lengthwise direction of respective fin structures 206.

In FIGS. 7A and 7B, a first spacer layer 220 and a second spacer layer 222 are formed over the structures illustrated in FIGS. 6A and 6B, respectively. The first spacer layer 220 and the second spacer layer 222 will be subsequently patterned to act as spacers for forming self-aligned source/drain regions. In FIGS. 7A and 7B, the first spacer layer 220 is formed on top surfaces of the STI regions 208; top surfaces and sidewalls of the fin structures 206, the nanostructures 203, and the masks 218; and sidewalls of the dummy gates 216 and the dummy gate dielectric 211. The second spacer layer 222 is deposited over the first spacer layer 220. The first spacer layer 220 may be formed of silicon oxide, silicon nitride, silicon oxynitride, or the like, using techniques such as thermal oxidation or deposited by CVD, ALD, or the like. The second spacer layer 222 may be formed of a material having a different etch rate than the material of the first spacer layer 220, such as silicon oxide, silicon nitride, silicon oxynitride, or the like, and may be deposited by CVD, ALD, or the like.

Figure 8B:
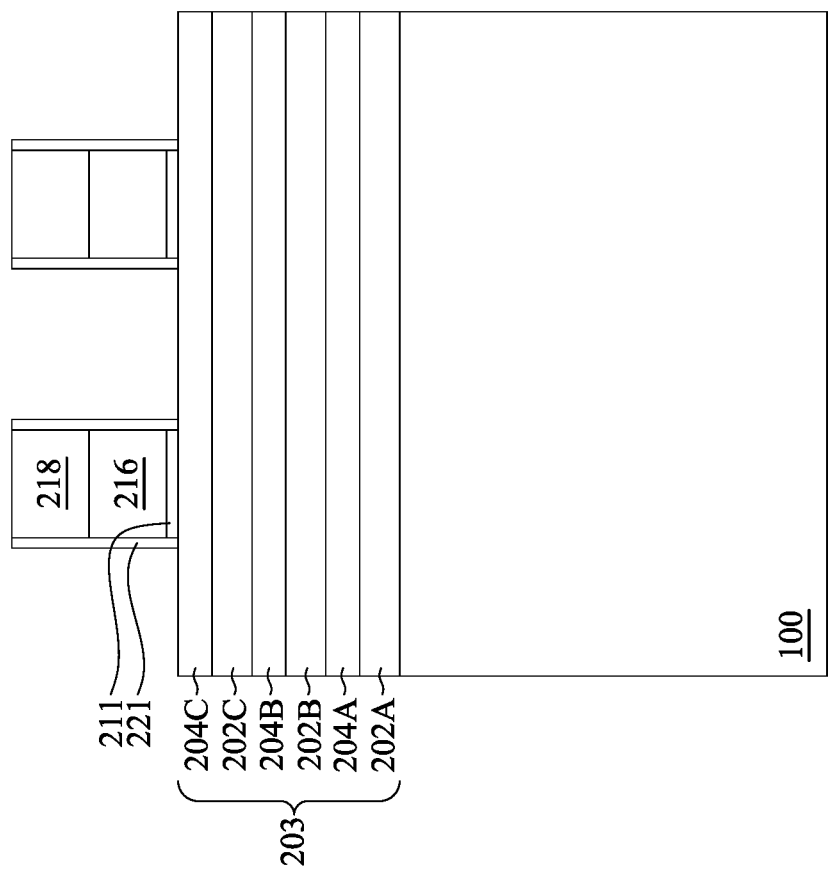
Figure 8A:
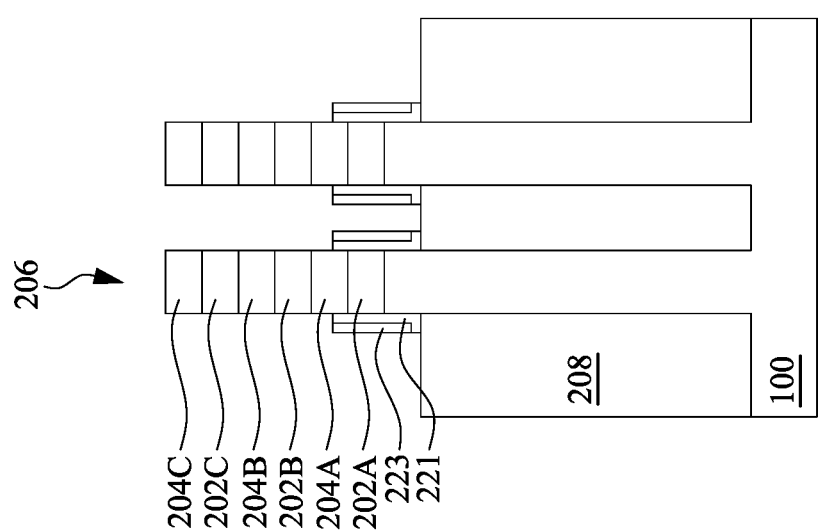

In FIGS. 8A and 8B, the first spacer layer 220 and the second spacer layer 222 are etched to form first spacers 221 and second spacers 223. As will be discussed in greater detail below, the first spacers 221 and the second spacers 223 act to self-align subsequently formed source and drain regions (collectively referred to as source/drain regions), as well as to protect sidewalls of the fin structures 206 and/or nanostructure 203 during subsequent processing. The first spacer layer 220 and the second spacer layer 222 may be etched using a suitable etching process, such as an isotropic etching process (e.g., a wet etching process), an anisotropic etching process (e.g., a dry etching process), or the like. In some embodiments, the material of the second spacer layer 222 has a different etch rate than the material of the first spacer layer 220, such that the first spacer layer 220 may act as an etch stop layer when patterning the second spacer layer 222 and such that the second spacer layer 222 may act as a mask when patterning the first spacer layer 220. For example, the second spacer layer 222 may be etched using an anisotropic etch process wherein the first spacer layer 220 acts as an etch stop layer, wherein remaining portions of the second spacer layer 222 form second spacers 223 as illustrated in FIG. 8A. Thereafter, the second spacers 223 acts as a mask while etching exposed portions of the first spacer layer 220, thereby forming first spacers 221 as illustrated in FIG. 8A.

As illustrated in FIG. 8A, the first spacers 221 and the second spacers 223 are disposed on sidewalls of the fin structures 206 and/or nanostructures 203. In some embodiments, the spacers 221 and 223 only partially remain on sidewalls of the fin structures 206. In some embodiments, no spacer remains on sidewalls of the fin structures 206. As illustrated in FIG. 8B, in some embodiments, the second spacer layer 222 may be removed from over the first spacer layer 220 adjacent the masks 218, the dummy gates 216, and the dummy gate dielectrics 211, and the first spacers 221 are disposed on sidewalls of the masks 218, the dummy gates 216, and the dummy dielectric layers 211. In other embodiments, a portion of the second spacer layer 222 may remain over the first spacer layer 220 adjacent the masks 218, the dummy gates 216, and the dummy gate dielectrics 211.

In some embodiments, the first spacers 221 on gate sidewalls (also called gate spacers) have a small thickness (e.g., in a range from about 1 nm to about 10 nm) so as to reduce gate-to-gate pitch without significant reduction in source/drain region size. In some embodiments, the first spacers 221 on gate sidewalls is formed of as low-dielectric constant (low-k) materials (e.g., porous silicon oxide) having a k-value, for example, less than about 3.5. The low-k material can aid in reducing parasitic capacitance between, for example, the subsequently formed metal gates and source/drain contacts.

The above disclosure generally describes a process of forming spacers. Other processes and sequences may be used. For example, fewer or additional spacers may be utilized, different sequence of steps may be utilized (e.g., the first spacers 221 may be patterned prior to depositing the second spacer layer 222), additional spacers may be formed and removed, and/or the like.

Figure 9B:
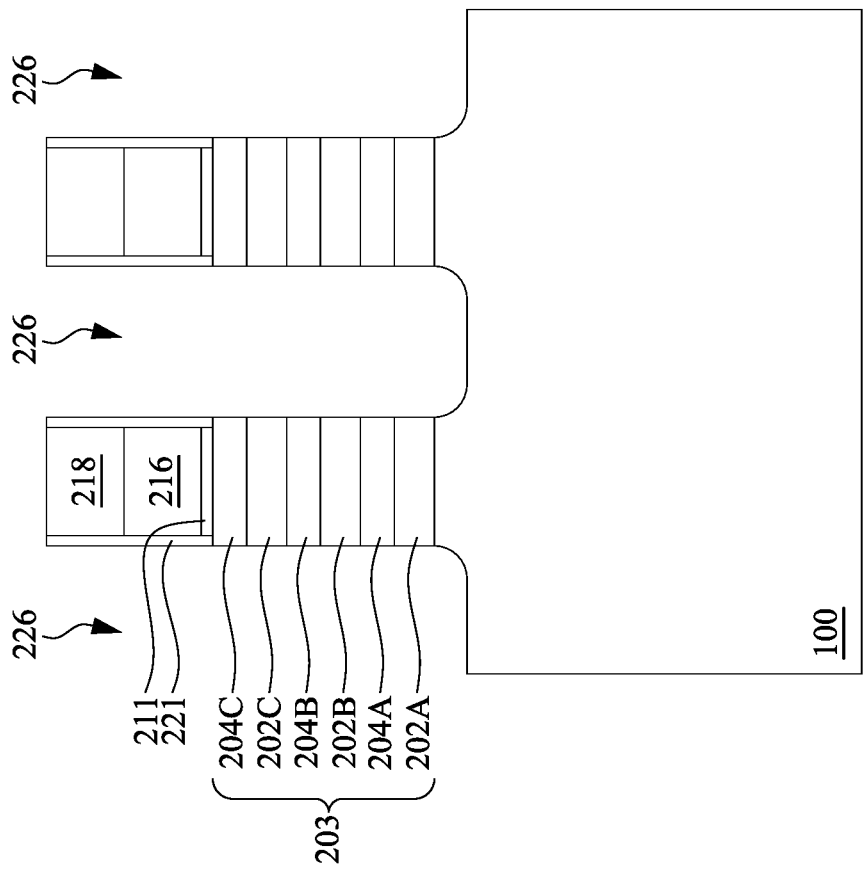
Figure 9A:
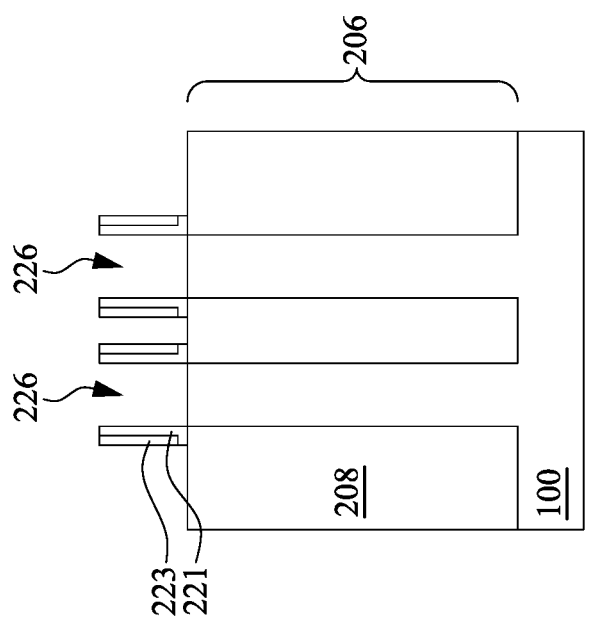

In FIGS. 9A and 9B, source/drain recesses 226 are formed in the fin structures 206, the nanostructures 203, and the substrate 100, in accordance with some embodiments. Epitaxial source/drain regions will be subsequently formed in the source/drain recesses 226. The source/drain recesses 226 may extend through the first nanostructures 202 and the second nanostructures 204, and into the substrate 100. As illustrated in FIG. 9A, bottom surfaces of the source/drain recesses 226 may be level with top surfaces of the STI regions 208, as an example. In some other embodiments, the fin structures 206 may be etched such that bottom surfaces of the source/drain recesses 226 are disposed below the top surfaces of the STI regions 208, or above the top surfaces of the STI regions 208. The source/drain recesses 226 may be formed by etching the fin structures 206, the nanostructures 203, and the substrate 100 using anisotropic etching processes, such as RIE, NBE, or the like. The first spacers 221, the second spacers 223, and the masks 218 mask portions of the fin structures 206, the nanostructures 203, and the substrate 100 during the etching processes used to form the source/drain recesses 226. A single etch process or multiple etch processes may be used to etch each layer of the nanostructures 203 and/or the fin structures 206. Timed etch processes may be used to stop the etching of the source/drain recesses 226 after the source/drain recesses 226 reach a target depth.

Figure 10B:
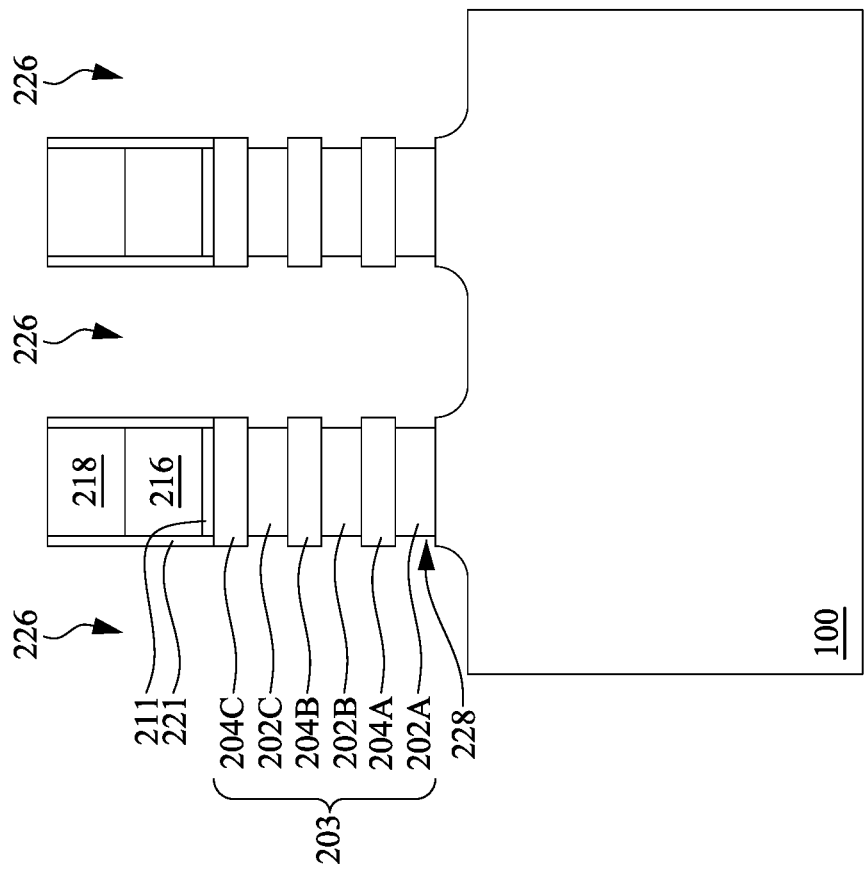
Figure 10A:
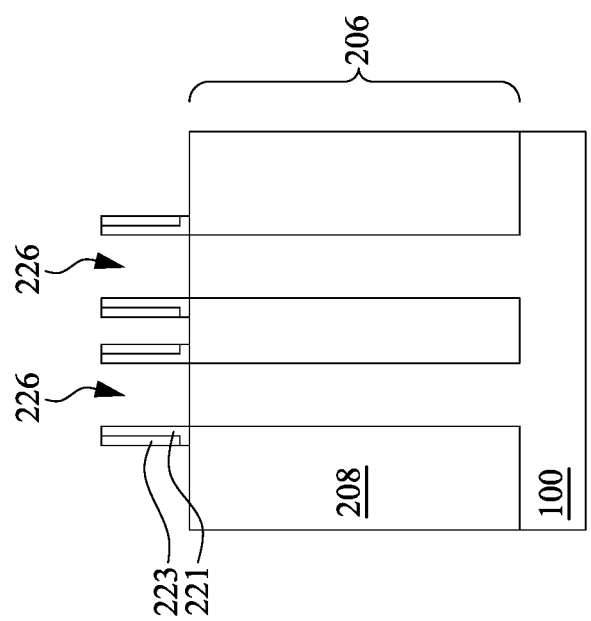

In FIGS. 10A and 10B, portions of sidewalls of the layers of the multi-layer stack 203 formed of the first semiconductor materials (e.g., the first nanostructures 202) exposed by the source/drain recesses 226 are etched to form sidewall recesses 228 between corresponding second nanostructures 204. Although sidewalls of the first nanostructures 202 in recesses 228 are illustrated as being straight in FIG. 10B, the sidewalls may be concave or convex. The sidewalls may be etched using isotropic etching processes, such as wet etching or the like. In some embodiments in which the first nanostructures 202 include, e.g., SiGe, and the second nanostructures 204 include, e.g., Si or SiC, a dry etch process with tetramethylammonium hydroxide (TMAH), ammonium hydroxide ($NH_4OH$), or the like may be used to etch sidewalls of the first nanostructures 202.

Figure 11B:
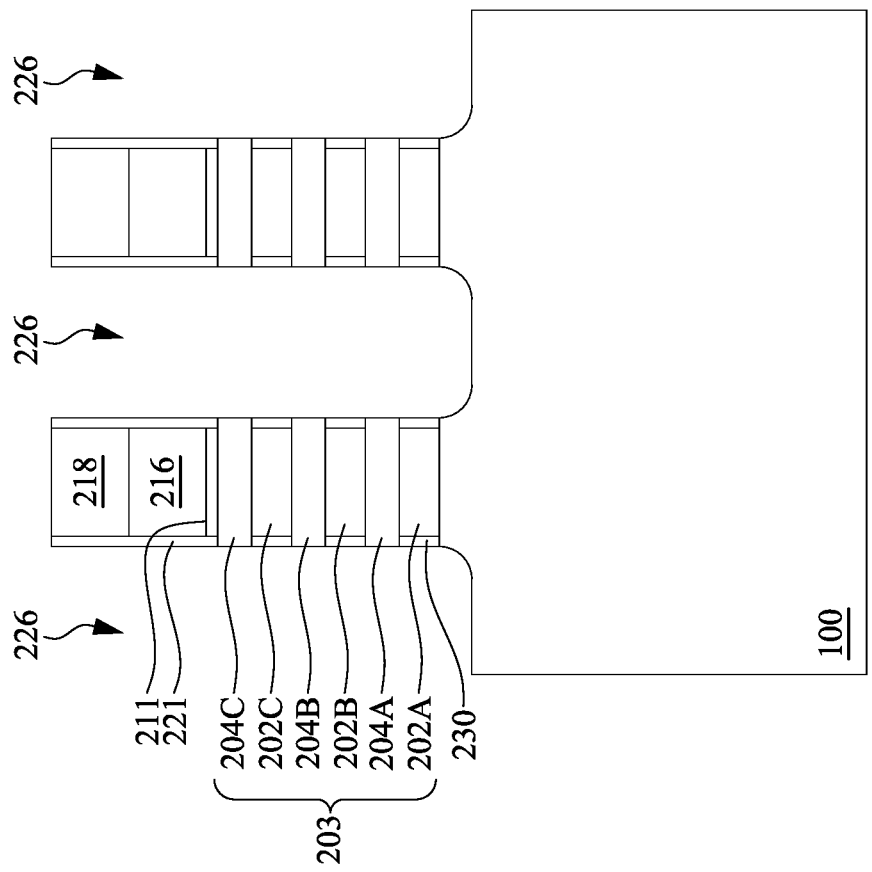
Figure 11A:
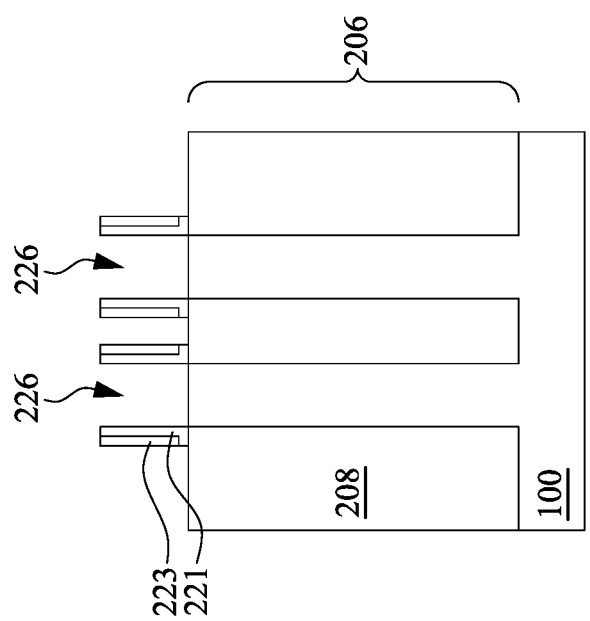
Figure 11C:
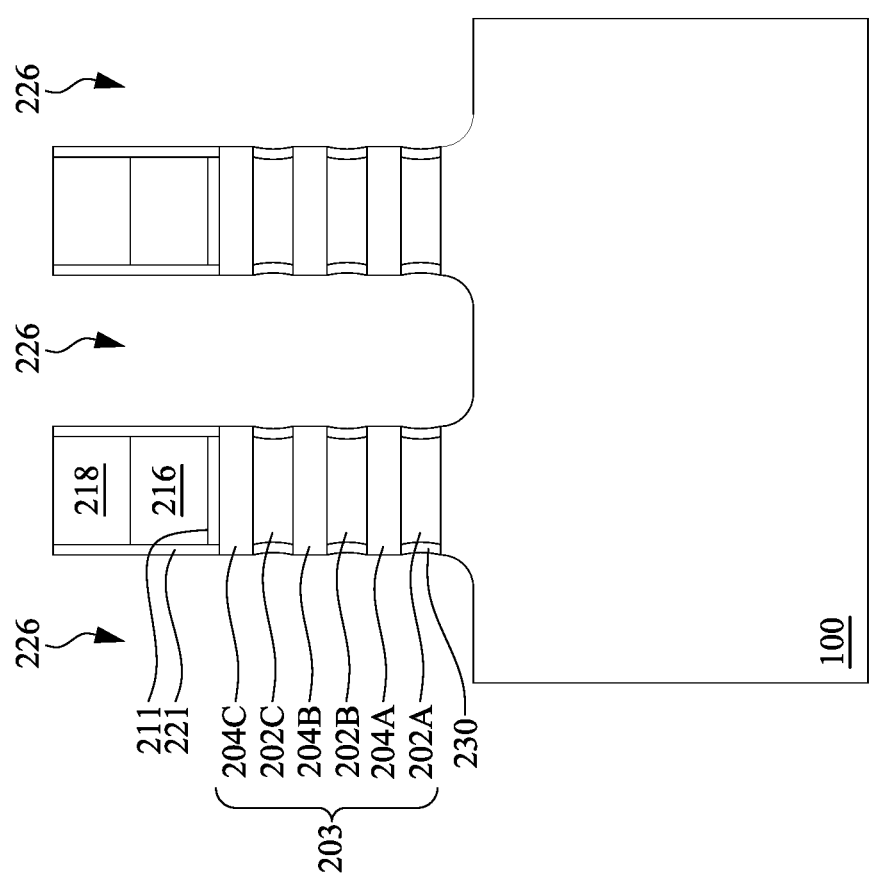

In FIGS. 11A-11C, inner spacers 230 are formed in the sidewall recess 228. The inner spacers 230 may be formed by depositing an inner spacer layer (not separately illustrated) over the structures illustrated in FIGS. 10A and 10B. The inner spacers 230 act as isolation features between subsequently formed source/drain regions and gate structure. As will be discussed in greater detail below, source/drain regions will be formed in the recesses 226, and the first nanostructures 202 will be replaced with corresponding gate structures.

The inner spacer layer may be deposited by a conformal deposition process, such as CVD, ALD, or the like. The inner spacer layer may comprise a material such as silicon nitride or silicon oxynitride, although any suitable material, such as low-dielectric constant (low-k) materials having a k-value less than about 3.5, may be utilized. The inner spacer layer may then be anisotropically etched to form the inner spacers 230. Although outer sidewalls of the inner spacers 230 are illustrated as being flush with sidewalls of the second nanostructures 204, the outer sidewalls of the inner spacers 230 may extend beyond or be recessed from sidewalls of the second nanostructures 204.

Moreover, although the outer sidewalls of the inner spacers 230 are illustrated as being straight in FIG. 11B, the outer sidewalls of the inner spacers 230 may be concave or convex. As an example, FIG. 11C illustrates an embodiment in which sidewalls of the first nanostructures 202 are concave, outer sidewalls of the inner spacers 230 are concave, and the inner spacers are recessed from sidewalls of the second nanostructures 204. The inner spacer layer may be etched by an anisotropic etching process, such as RIE, NBE, or the like. The inner spacers 230 may be used to prevent damage to subsequently formed source/drain regions (such as the epitaxial source/drain regions 232, discussed below with respect to FIGS. 12A-12D) by subsequent etching processes, such as etching processes used to form gate structures.

Figure 12D:
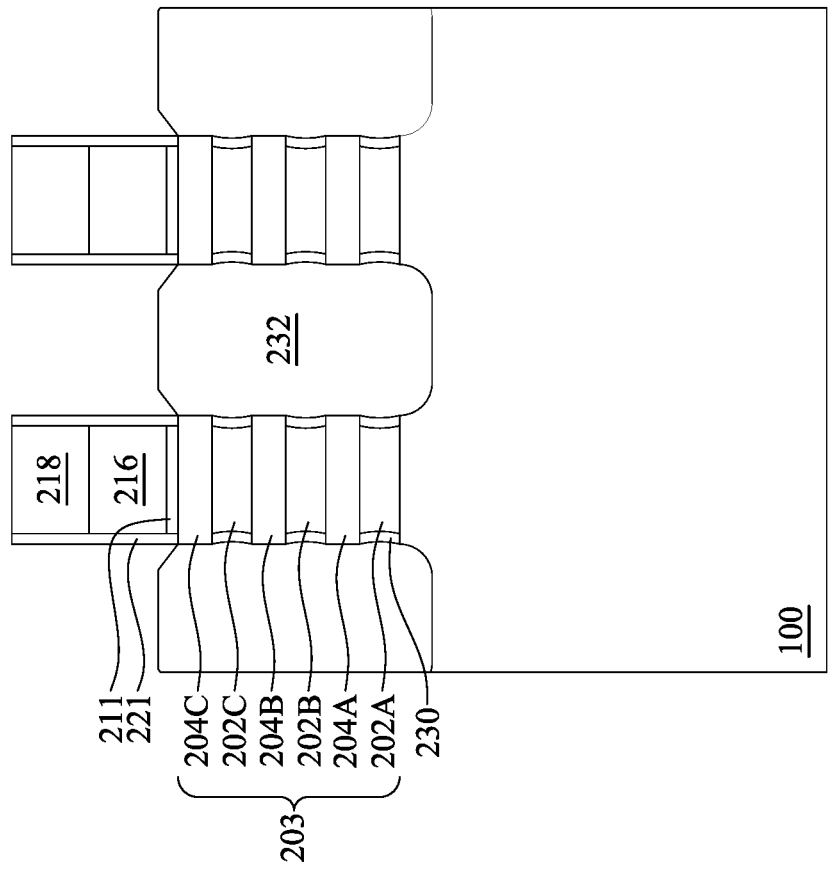

In FIGS. 12A-12D, epitaxial source/drain regions 232 are formed in the source/drain recesses 226. In some embodiments, the source/drain regions 232 may exert stress on the second nanostructures 204, thereby improving device performance. As illustrated in FIG. 12B, the epitaxial source/drain regions 232 are formed in the source/drain recesses 226 such that each dummy gate 216 is disposed between respective neighboring pairs of the epitaxial source/drain regions 232. In some embodiments, the first spacers 221 are used to separate the epitaxial source/drain regions 232 from the dummy gates 212, and the inner spacers 230 are used to separate the epitaxial source/drain regions 232 from the first nanostructures 202 by an appropriate lateral distance so that the epitaxial source/drain regions 232 do not short out with subsequently formed gates of the resulting GAA-FETs.

In some embodiments, the epitaxial source/drain regions 232 may include any acceptable material appropriate for n-type GAA-FETs. For example, if the second nanostructures 204 are silicon, the epitaxial source/drain regions 232 may include materials exerting a tensile strain on the second nanostructures 204, such as silicon carbide, phosphorous doped silicon carbide, silicon phosphide, or the like. In some embodiments, the epitaxial source/drain regions 232 may include any acceptable material appropriate for p-type GAA-FETs. For example, if the second nanostructures 204 are silicon, the epitaxial source/drain regions 232 may comprise materials exerting a compressive strain on the second nanostructures 204, such as silicon germanium, boron doped silicon germanium, germanium, germanium tin, or the like. The epitaxial source/drain regions 232 may have surfaces raised from respective upper surfaces of the nanostructures 203 and may have facets.

The epitaxial source/drain regions 232 may be implanted with dopants to form source/drain regions, followed by an anneal. The source/drain regions may have an impurity concentration of between about $1 \times 10^{17}$ atoms/cm 3 and about $1 \times 10^{22}$ atoms/cm$^3$. The n-type and/or p-type impurities for source/drain regions may be any of the impurities previously discussed. In some embodiments, the epitaxial source/drain regions 232 may be in situ doped during growth.

Figure 12C:
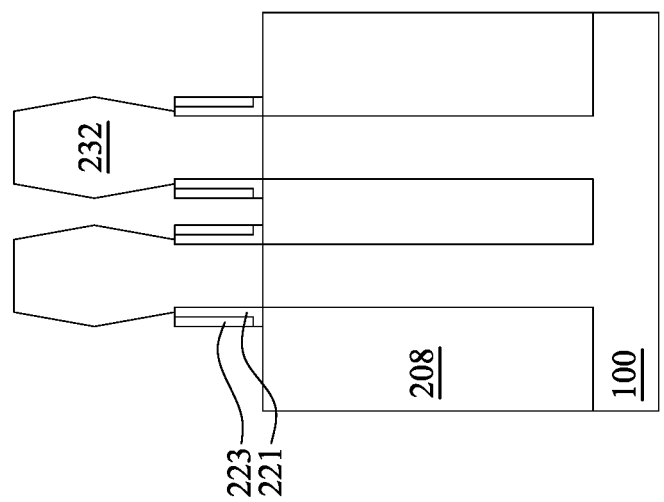

As a result of the epitaxy processes used to form the epitaxial source/drain regions 232, upper surfaces of the epitaxial source/drain regions 232 have facets which expand laterally outward beyond sidewalls of the nanostructures 203. In some embodiments, these facets cause adjacent epitaxial source/drain regions 232 to merge as illustrated by FIG. 12A. In some other embodiments, adjacent epitaxial source/drain regions 232 remain separated after the epitaxy process is completed as illustrated by FIG. 12C. In the embodiments illustrated in FIGS. 12A and 12C, the first spacers 221, 223 may be formed to a top surface of the STI regions 208 thereby blocking the lateral epitaxial growth. In some other embodiments, the spacer etch used to form the first spacers 221, 223 may be adjusted to remove the spacer material to allow the epitaxially grown region to extend to the surface of the STI region 208.

The epitaxial source/drain regions 232 may comprise one or more semiconductor material layers. For example, the epitaxial source/drain regions 232 may comprise a first semiconductor material layer 232A, a second semiconductor material layer 232B, and a third semiconductor material layer 232C, which are distinguished in FIGS. 12A and 12B by using dash lines. Any number of semiconductor material layers may be used for the epitaxial source/drain regions 232. Each of the first semiconductor material layer 232A, the second semiconductor material layer 232B, and the third semiconductor material layer 232C may be formed of different semiconductor materials and may be doped to different dopant concentrations. In some embodiments, the first semiconductor material layer 232A may have a dopant concentration less than the second semiconductor material layer 232B and greater than the third semiconductor material layer 232C. In embodiments in which the epitaxial source/drain regions 232 comprise three semiconductor material layers, the first semiconductor material layer 232A may be deposited, the second semiconductor material layer 232B may be deposited over the first semiconductor material layer 232A, and the third semiconductor material layer 232C may be deposited over the second semiconductor material layer 232B.

FIG. 12D illustrates an embodiment in which sidewalls of the first nanostructures 202 are concave, outer sidewalls of the inner spacers 230 are concave, and the inner spacers 230 are recessed from sidewalls of the second nanostructures 204. As illustrated in FIG. 12D, the epitaxial source/drain regions 232 may be formed in contact with the inner spacers 230 and may extend past sidewalls of the second nanostructures 204.

Figure 13B:
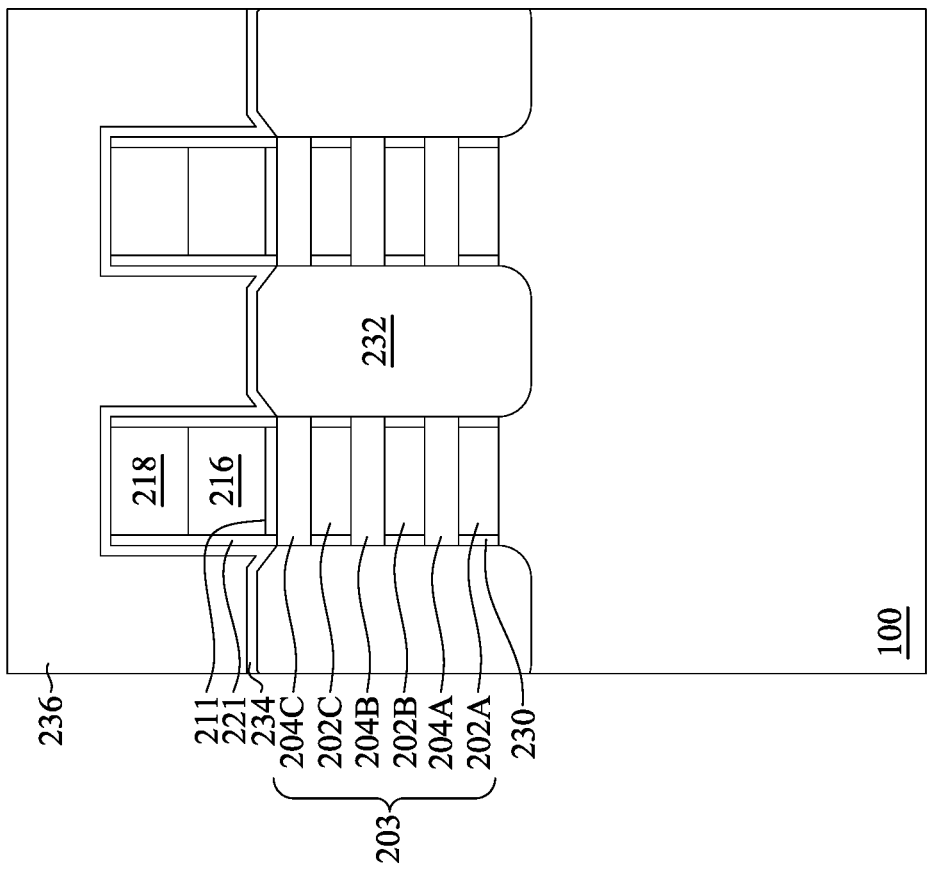
Figure 13A:
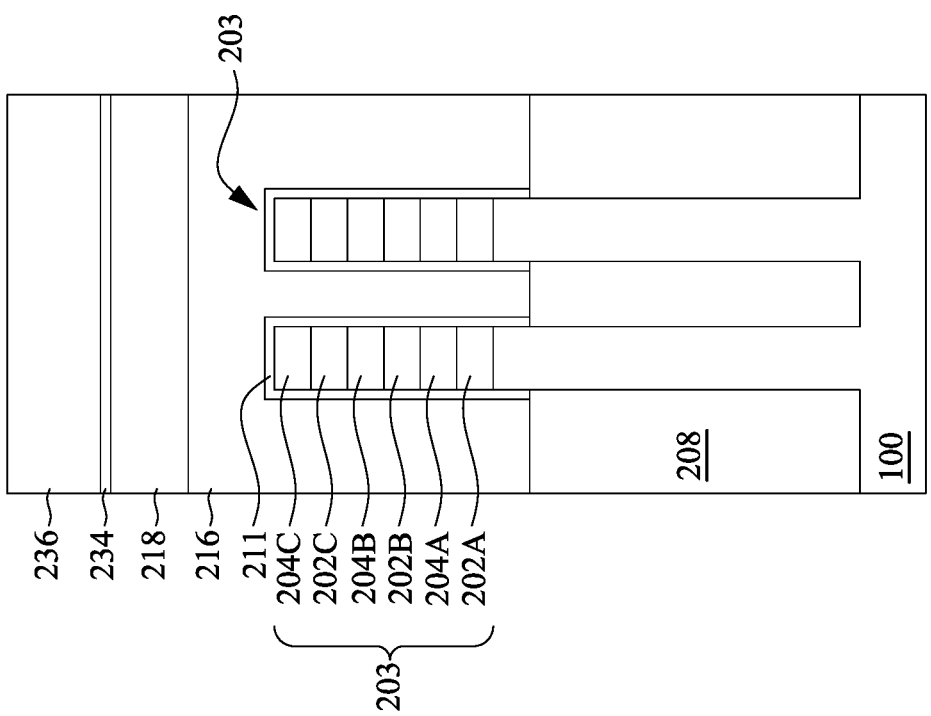
Figure 13C:
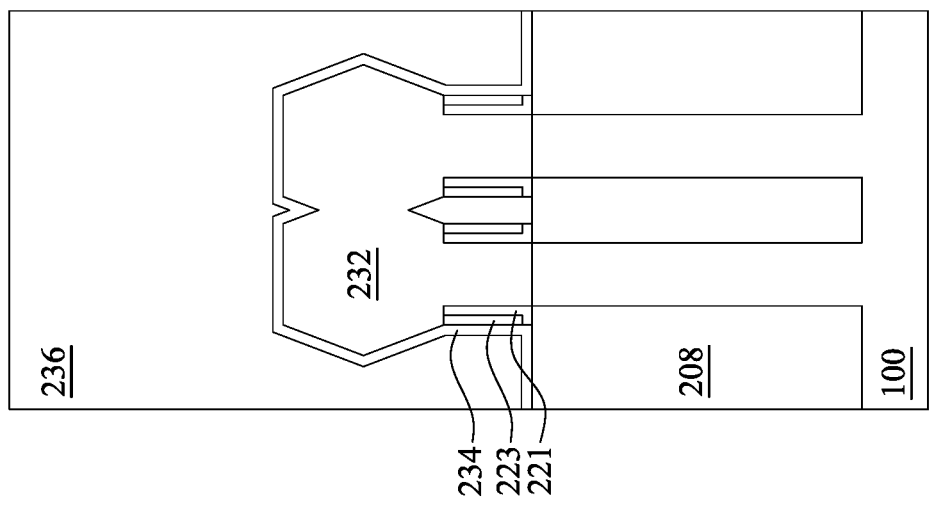

In FIGS. 13A-13C, an interlayer dielectric (ILD) layer 236 is deposited over the structure illustrated in FIGS. 12A-12D. The ILD layer 236 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 234 is disposed between the ILD layer 236 and the epitaxial source/drain regions 232, the masks 214, and the first spacers 221. The CESL 234 may comprise a dielectric material, such as, SiN, $SiO_x$, SiCN, SiON, SiOCN, $Al_2O_3$, $HfO_2$, $ZrO_2$, $HfAlO_x$, and $HfSiO_x$, or the like, having a different etch rate than the material of the overlying ILD layer 236.

Figure 14B:
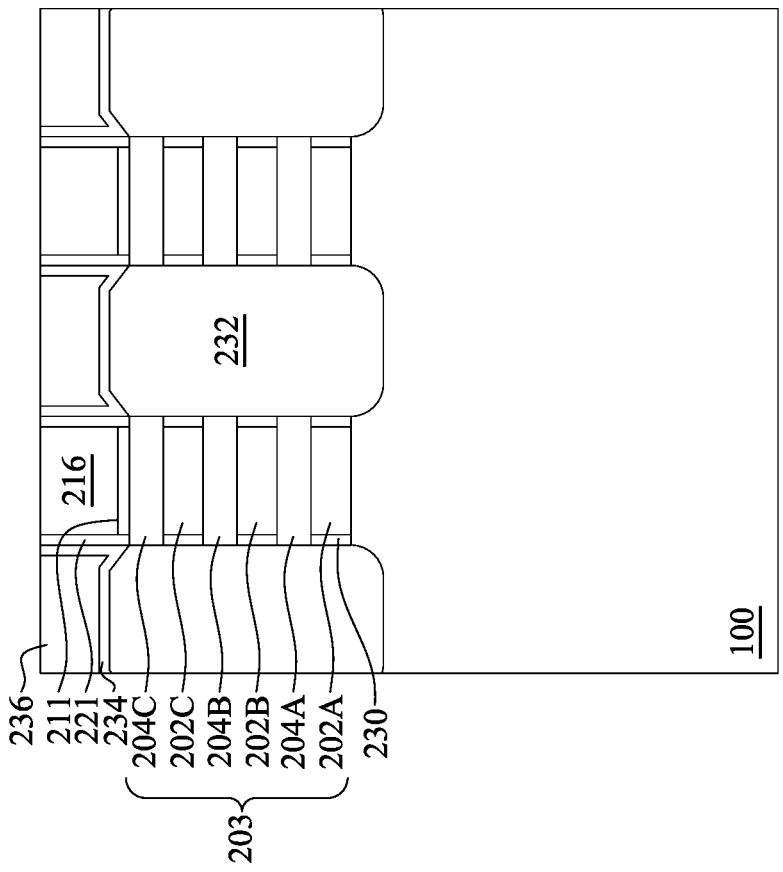
Figure 14A:
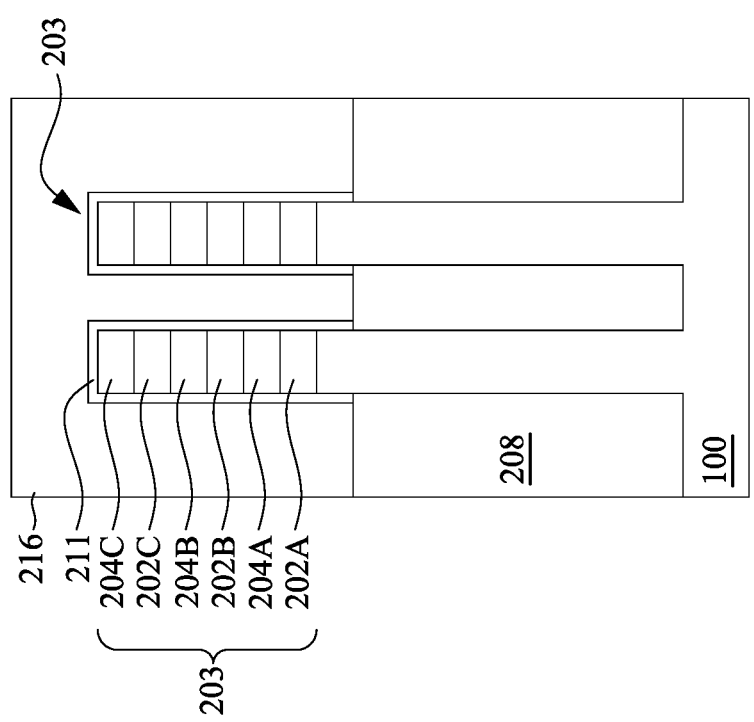

In FIGS. 14A-14B, a planarization process, such as a CMP, may be performed to level the top surface of the ILD layer 236 with the top surfaces of the dummy gates 216 or the masks 218. The planarization process may also remove the masks 218 on the dummy gates 216, and portions of the first spacers 221 along sidewalls of the masks 218. After the planarization process, top surfaces of the dummy gates 216, the first spacers 221, and the ILD layer 236 are level within process variations. Accordingly, the top surfaces of the dummy gates 212 are exposed through the ILD layer 236. In some embodiments, the masks 218 may remain, in which case the planarization process levels the top surface of the ILD layer 236 with top surface of the masks 218 and the first spacers 221.

Figure 15B:
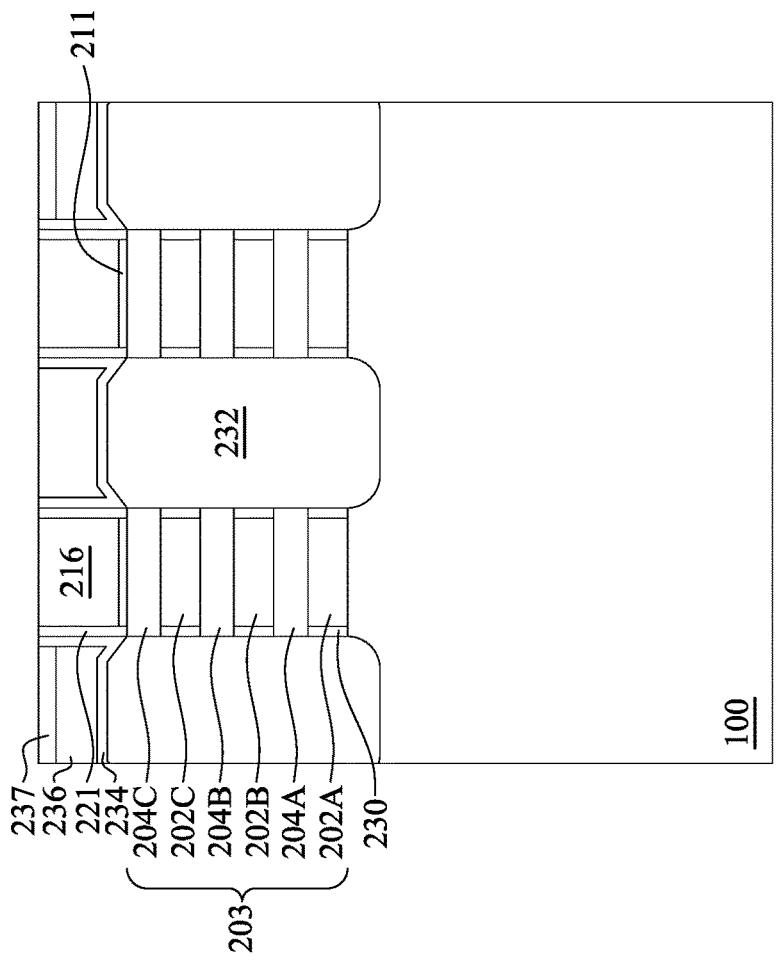
Figure 15A:
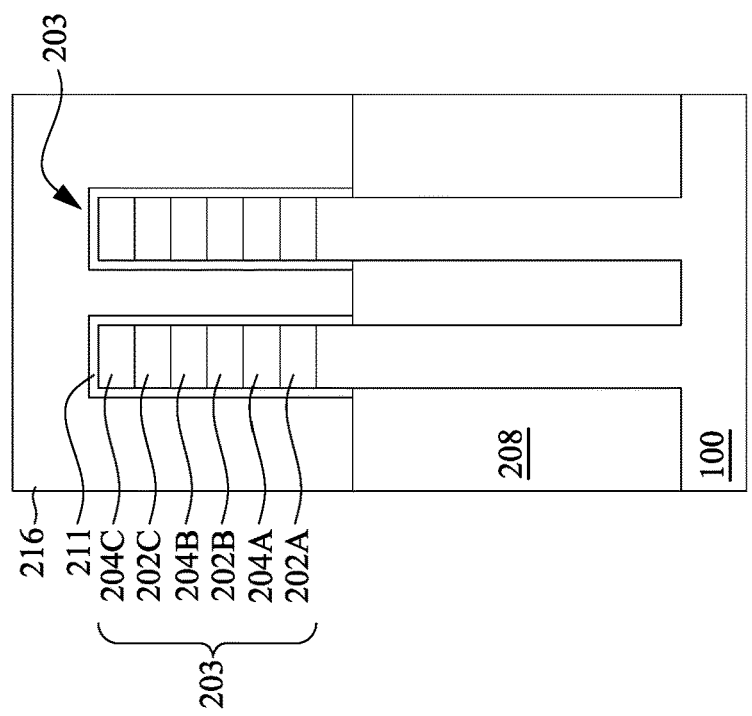

In FIGS. 15A and 15B, the ILD layer 236 is etched back to fall below the dummy gates 216, and then a protective layer 237 is formed over the ILD layer 236. The protective layer 237 has a higher etch resistance to a following metal gate etch back (MGEB) process than that of the ILD layer 236, and thus the protective layer 237 can serve to protect the underlying ILD layer 236 from potential loss or damage caused by the following MGEB process. The protective layer 237 can be formed by, for example, depositing a layer of dielectric material globally over the substrate 100, followed by performing a planarization process, such as CMP, on the deposited layer of dielectric material until the dummy gates 216 get exposed. In some embodiments, the ILD layer 236 is an oxide-based dielectric material (e.g., silicon oxide), and the protective layer 237 is a nitride-based dielectric material (e.g., silicon nitride).

Figure 16B:
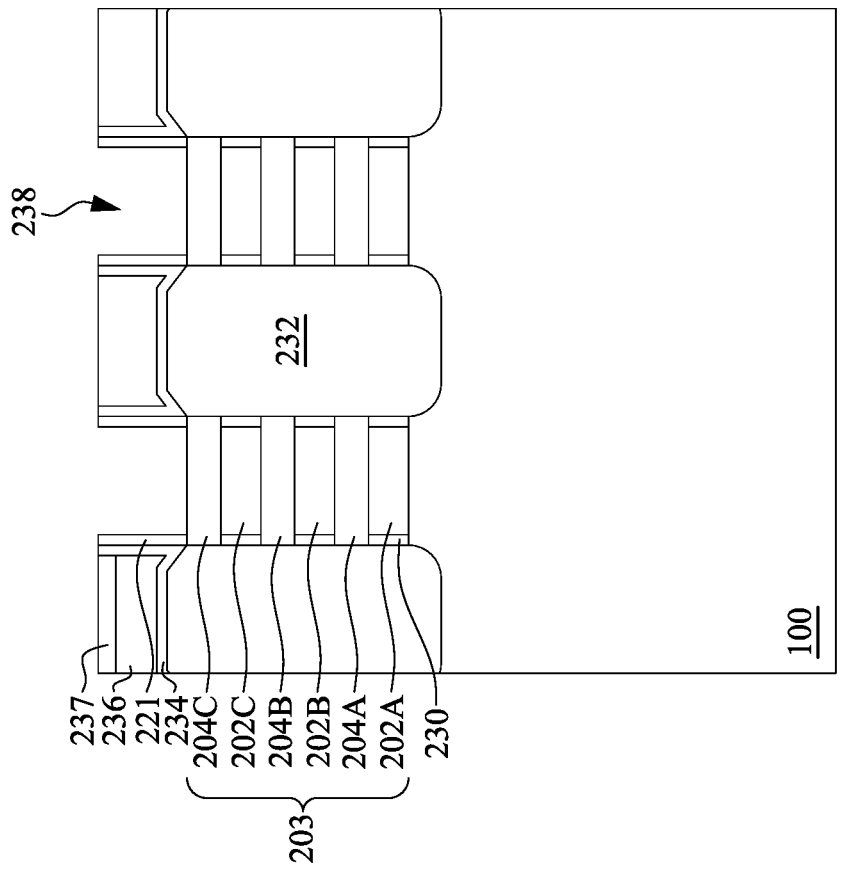
Figure 16A:
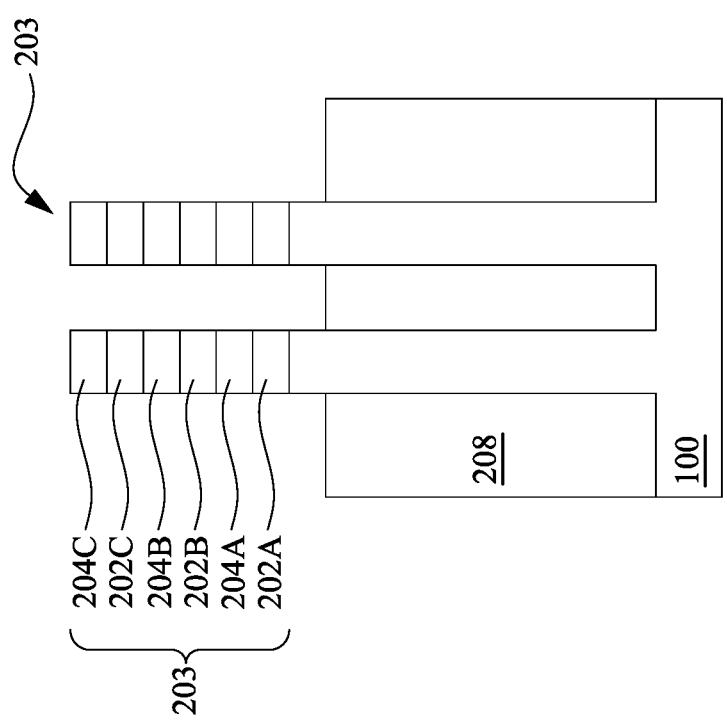

In FIGS. 16A and 16B, the dummy gates 216, and the masks 218 if present, are removed in one or more etching steps, so that gate trenches 238 are formed between corresponding gate spacers 221. In some embodiments, portions of the dummy gate dielectrics 211 in the gate trenches 238 are also be removed. In some embodiments, the dummy gates 216 and the dummy gate dielectrics 211 are removed by an anisotropic dry etch process. For example, the etching process may include a dry etch process using reaction gas(es) that selectively etch the dummy gates 216 at a faster rate than the protective layer 237 or the first spacers 221. Each gate trench 238 exposes and/or overlies portions of nanostructures 204, which will serve as channel regions in subsequently completed GAA-FETs. The nanostructures 204 serving as the channel regions are disposed between neighboring pairs of the epitaxial source/drain regions 232. During the removal, the dummy dielectric layers 211 may be used as etch stop layers when the dummy gates 216 are etched. The dummy dielectric layers 211 may then be removed after the removal of the dummy gates 216.

Figure 17B:
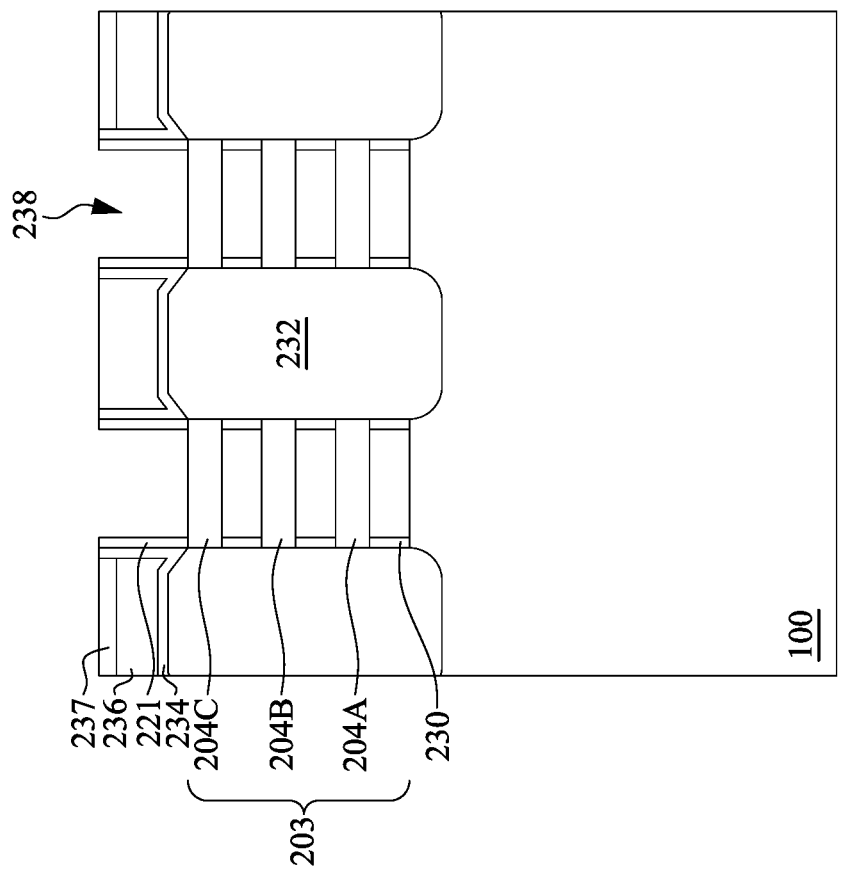
Figure 17A:
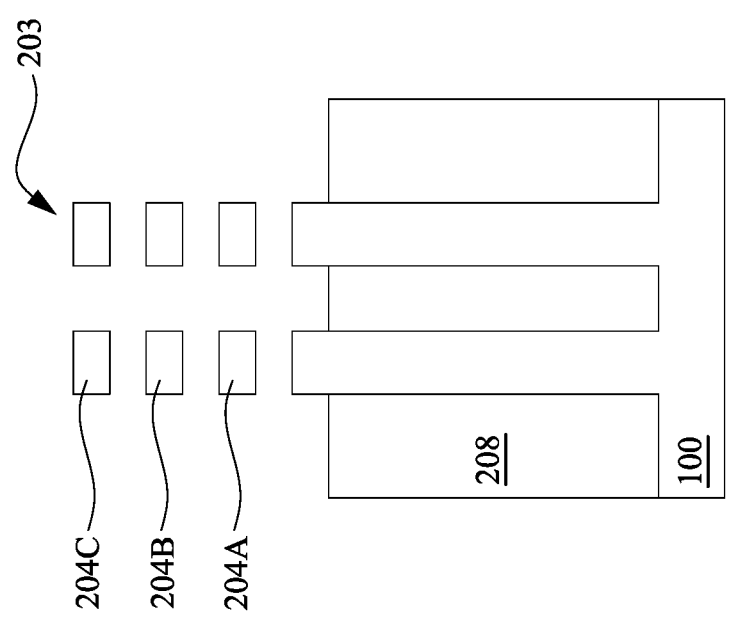

In FIGS. 17A and 17B, the first nanostructures 202 in the gate trenches are removed by an isotropic etching process such as wet etching or the like using etchants which are selective to the materials of the first nanostructures 202. Stated differently, the first nanostructures 202 are removed by using a selective etching process that etches the first nanostructures 202 at a faster etch rate than it etches the second nanostructures 204, thus forming spaces between the second nanostructures 204 (also referred to as sheet-to-sheet spaces if the nanostructures 204 are nanosheets). This step can be referred to as a channel release process. At this interim processing step, the spaces between second nanostructures 204 may be filled with ambient environment conditions (e.g., air, nitrogen, etc). In some embodiments, the second nanostructures 204 can be referred to as nanosheets, nanowires, nanoslabs, nanorings having nanoscale size (e.g., a few nanometers), depending on their geometry. For example, in some embodiments the second nanostructures 204 may be trimmed to have a substantial rounded shape (i.e., cylindrical) due to the selective etching process for completely removing the first nanostructures 202. In that case, the resultant second nanostructures 204 can be called nanowires.

In embodiments in which the first nanostructures 202 include, e.g., SiGe, and the second nanostructures 204 include, e.g., Si or SiC, tetramethylammonium hydroxide (TMAH), ammonium hydroxide ($NH_4OH$) or the like may be used to remove the first nanostructures 202. In some embodiments, both the channel release step and the previous step of laterally recessing first nanostructures 202 (i.e., the step as illustrated in FIGS. 10A-10B) use a selective etching process that etches first nanostructures 202 (e.g., SiGe) at a faster etch rate than etching second nanostructures 204 (e.g., Si), and therefore these two steps may use the same etchant chemistry in some embodiments. In this case, the etching time/duration of channel release step is longer than the etching time/duration of the previous step of laterally recessing first nanostructures 202, so as to completely remove the sacrificial nanostructures 202.

In FIGS. 18A and 18B, replacement gate structures 240 are respectively formed in the gate trenches 238 to surround each of the nanosheets 204 suspended in the gate trenches 238. The gate structures 240 may be final gates of GAA FETs. The final gate structure may be a high-k/metal gate stack, however other compositions are possible. In some embodiments, each of the gate structures 240 forms the gate associated with the multi-channels provided by the plurality of nanosheets 204. For example, high-k/metal gate structures 240 are formed within the sheet-to-sheet spaces provided by the release of nanosheets 204. In various embodiments, the high-k/metal gate structure 240 includes an interfacial layer 242 formed around the nanosheets 204, a high-k gate dielectric layer 244 formed around the interfacial layer 242, and a gate metal layer 246 formed around the high-k gate dielectric layer 244 and filling a remainder of gate trenches 238. Formation of the high-k/metal gate structures 240 may include one or more deposition processes to form various gate materials, followed by a CMP process to remove excessive gate materials, resulting in the high-k/metal gate structures 240 having top surfaces level with a top surface of the protective layer 237. As illustrated in the cross-sectional view of FIG. 18A, the high-k/metal gate structure 240 surrounds each of the nanosheets 204, and thus is referred to as a gate of a GAA FET.

In some embodiments, the interfacial layer 242 is silicon oxide formed on exposed surfaces of semiconductor materials in the gate trenches 238 by using, for example, thermal oxidation, chemical oxidation, wet oxidation or the like. As a result, surface portions of the nanosheets 204 exposed in the gate trenches 238 are oxidized into silicon oxide to form interfacial layer 242.

In some embodiments, the high-k gate dielectric layer 244 includes dielectric materials such as hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), the like, or combinations thereof.

In some embodiments, the gate metal layer 246 includes one or more metal layers. For example, the gate metal layer 246 may include one or more work function metal layers stacked one over another and a fill metal filling up a remainder of gate trenches 238. The one or more work function metal layers in the gate metal layer 246 provide a suitable work function for the high-k/metal gate structures 240. For an n-type GAA FET, the gate metal layer 246 may include one or more n-type work function metal (N-metal) layers. The n-type work function metal may exemplarily include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials. On the other hand, for a p-type GAA FET, the gate metal layer 246 may include one or more p-type work function metal (P-metal) layers. The p-type work function metal may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials. In some embodiments, the fill metal in the gate metal layer 246 may exemplarily include, but are not limited to, tungsten, aluminum, copper, nickel, cobalt, titanium, tantalum, titanium nitride, tantalum nitride, nickel silicide, cobalt silicide, TaC, TaSiN, TaCN, TiAl, TiAlN, or other suitable materials.

Figures 19A, 19B:
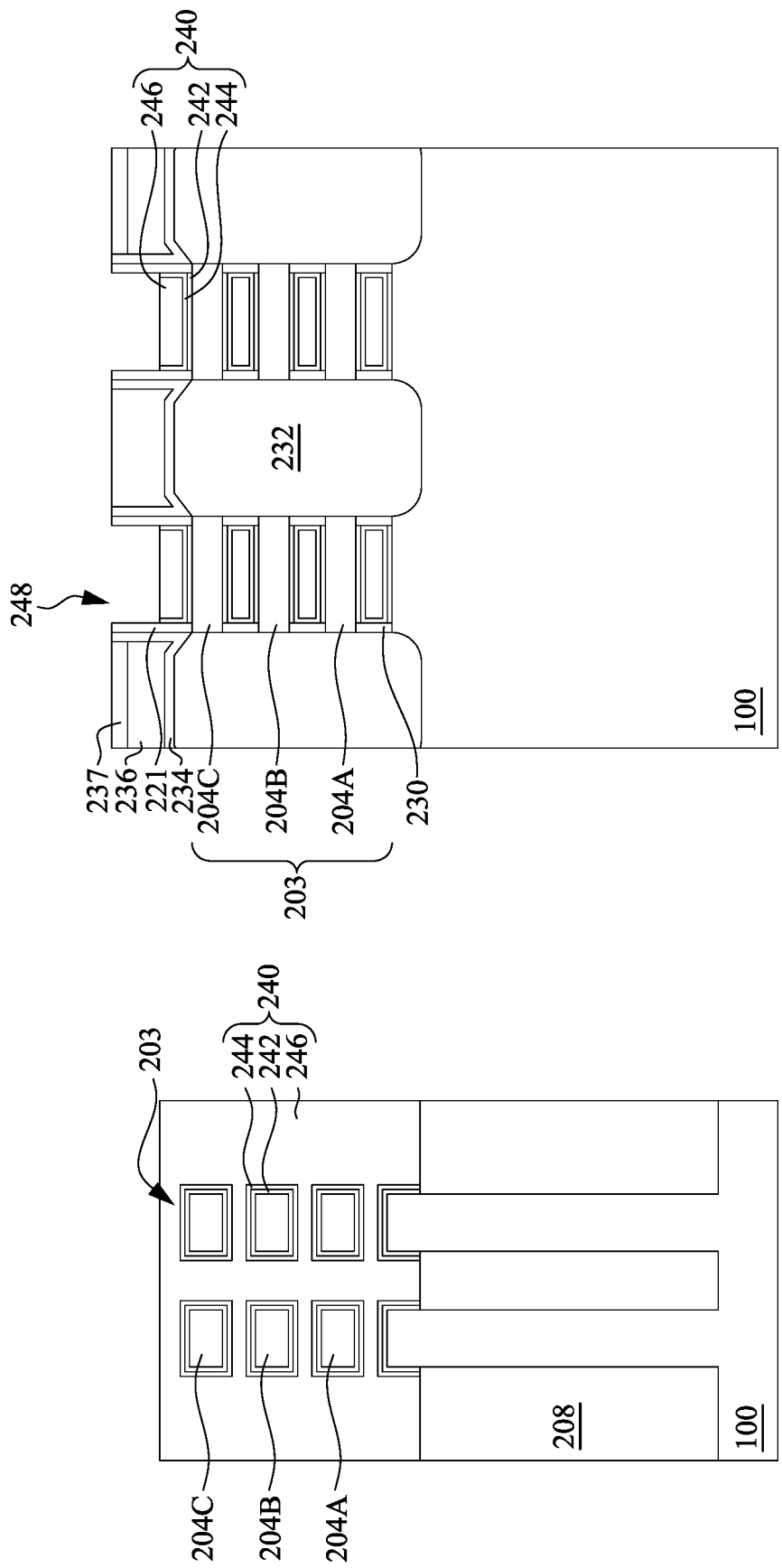

In FIGS. 19A and 19B, a metal gate etch back (MGEB) process is performed to etch back the gate structures 240, resulting in gate trenches 248 again between corresponding gate spacers 221. The gate trenches 248 have a smaller depth than the previous gate trenches 238 formed from dummy gate removal as illustrated in FIGS. 17A and 17B, because only upper portions of the gate structures 240 are removed. In some embodiments, the MGEB process is a selective etching process (e.g., selective dry etching, selective wet etching, or combinations thereof) that etches the materials of the high-k/metal gate structures 240 at a faster etch rate than etching other materials (e.g., protective layer 237, spacers 221 and CESL 234). The protective layer 237 thus protects the ILD layer 234 from possible loss/damage caused by the MGEB process.

Figures 20A, 20B:
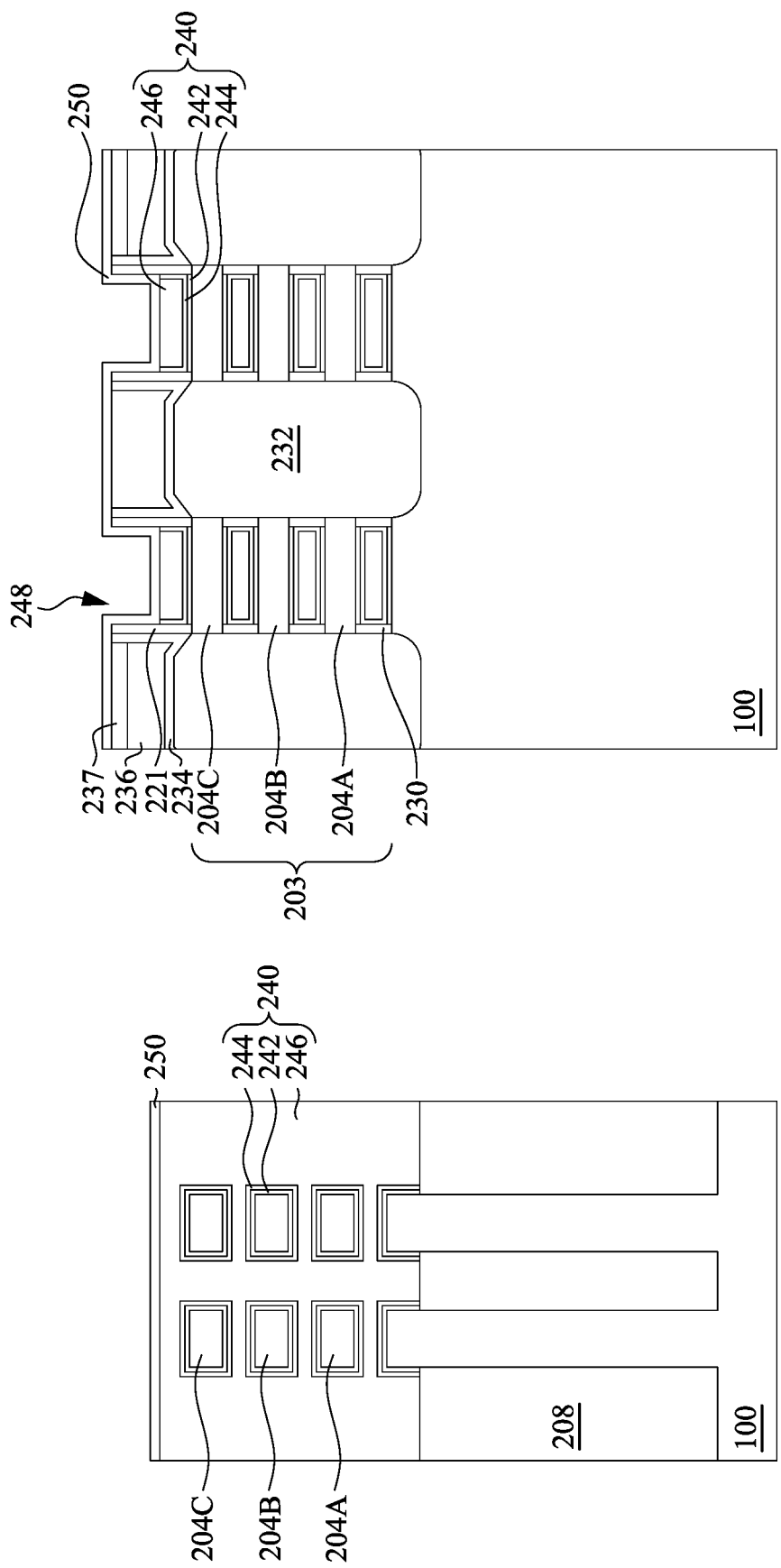

In FIGS. 20A and 20B, a dielectric liner layer 250 is conformally deposited over the substrate 100, thus lining sidewalls and bottom surfaces of the gate trenches 248. Because the major function of the dielectric liner layer 250 serves to provide sufficient isolation between gate and source/drain contacts, the dielectric liner layer 250 has a relaxed concern about its dielectric constant. Therefore, the dielectric liner layer 250 may have a higher dielectric constant than the gate spacers 221. In some embodiments, the dielectric liner layer 250 may include, for example, SiN, $SiO_x$, SiCN, SiON, SiOCN, $Al_2O_3$, $HfO_2$, $ZrO_2$, $HfAlO_x$, $HfSiO_x$, the like, or combinations thereof, and may be deposited using for example, ALD, CVD, plasma enhanced ALD (PEALD), plasma enhanced CVD (PECVD), or other suitable deposition techniques. In some embodiments, the gate spacers 221 are silicon nitride, and the dielectric liner layer 250 is metal oxide.

Thereafter, an anisotropic etching process is performed on the dielectric liner layer 250 to remove horizontal portions of the dielectric liner layer 250 from bottom surfaces of the gate trenches 258 and top surfaces of the protective layer 237, while leaving vertical portions of the dielectric liner layer 250 to serve as dielectric liners 252 lining sidewalls of the gate trenches 258. The resultant structure is illustrated in FIGS. 21A and 21B. The dielectric liners 252 can increase a distance from a subsequently formed refill metal 254 (shown in FIGS. 22A-22B) to a subsequently formed source/drain contact, thus reducing the isolation breakdown risk. In particular, the dielectric liners 252 are localized to peripheral regions of the top surface of gate structure 240, while leaving a non-peripheral region of the top surface of gate structure 240 exposed to receive the subsequently formed refill metal. The dielectric liners 252 have a smaller height than the gate spacers 221, because the dielectric liners 252 are above the top surfaces of the gate structures 540.

In some embodiments, the anisotropic etching may be performed by a dry chemical etch with a plasma source and a reaction gas. The plasma source may be an inductively coupled plasma (ICR) source, a transformer coupled plasma (TCP) source, an electron cyclotron resonance (ECR) source or the like, and the reaction gas may be, for example, a fluorine-based gas (such as $SF_6$, $CH_2F_2$, $CH_3F$, $CHF_3$, or the like), chloride-based gas (e.g., $Cl_2$), the like, or combinations thereof. Again, the protective layer 237 protects the underlying ILD layer 236 from possible loss or damage caused by the anisotropic etching process.

Figure 21C:
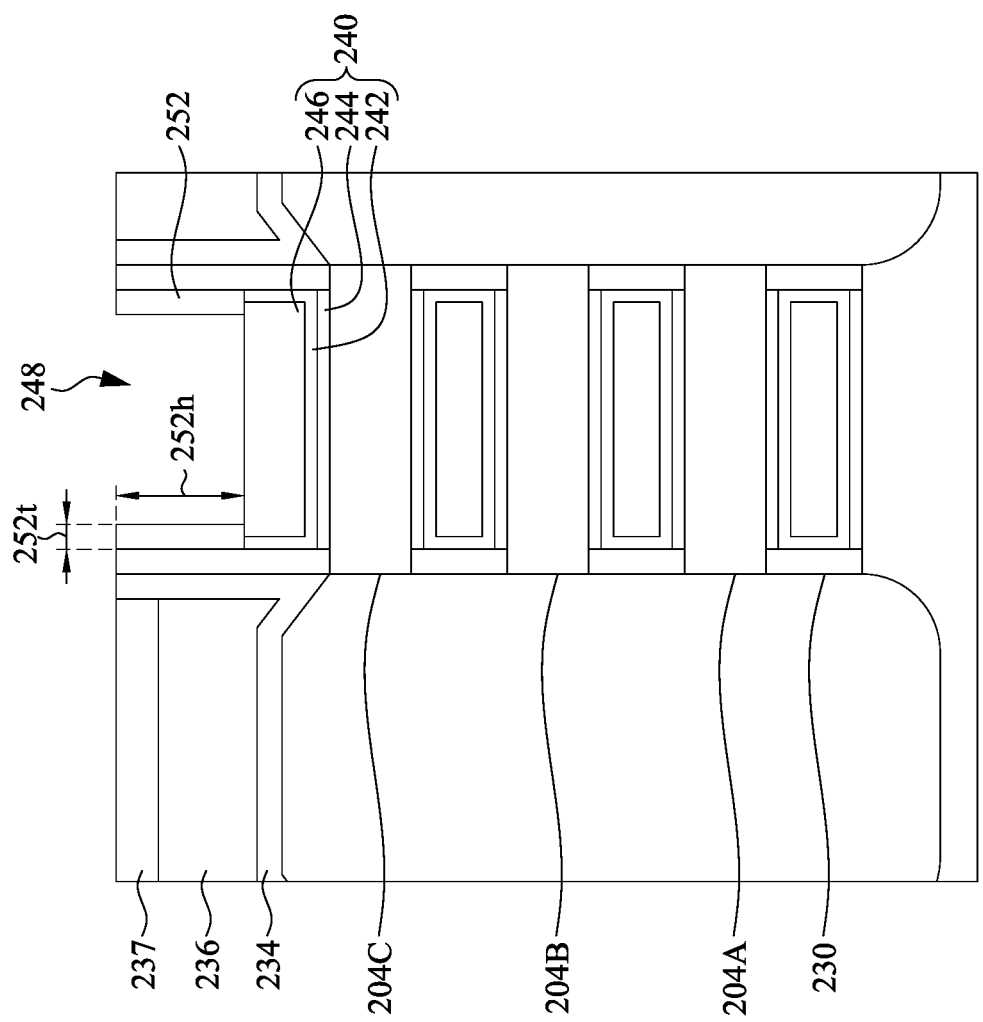
FIG. 21C is a zoomed-in cross-sectional view of the structure shown in FIG. 21B.

FIG. 21C is a zoomed-in view of the structure shown in FIG. 21B. As illustrated in FIG. 21C, the dielectric liner 252 has a thickness 252t measured from an innermost sidewall of the dielectric liner 252 exposed in the gate trench 248 to an outermost sidewall of the dielectric liner 252 facing away from the gate trench 248. In some embodiments, the thickness 252t of the dielectric liner 252 is in a range from about 0.5 nm to about 10 nm. If the thickness 252t of the dielectric liner 252 is excessively large (i.e., greater than about 10 nm), subsequently formed refill metal (illustrated in FIGS. 22A and 22B) may have unwanted voids, because an increased aspect ratio in the gate trench 248 (i.e., ratio of gate trench depth to gate trench width) may cause increased challenge in depositing refill metal in the gate trench 248. If the thickness 252t of the dielectric liner 252 is excessively small (i.e., less than 0.5 nm), the dielectric liner 252 may provide insufficient improvement in preventing the isolation breakdown.

As illustrated in FIG. 21C, the dielectric liner 252 has a height 252h measured from a bottom surface of the dielectric liner 252 to a top surface of the dielectric liner 252. In some embodiments, the height 252h of the dielectric liner 252 is in a range from about 0.2 nm to about 30 nm. If the height 252h of the dielectric liner 252 is excessively large (e.g., greater than about 30 nm), which means the gate trench 248 has a deep depth, then the subsequently formed refill metal (illustrated in FIGS. 22A and 22B) may have unwanted voids, because an increased aspect ratio in the gate trench 248 (i.e., ratio of gate trench depth to gate trench width) may cause increased challenge in depositing the refill metal in the gate trench 248. If the height 252h of the dielectric liner 252 is excessively small (e.g., less than about 0.5 nm), which means the gate trench 248 has a shallow depth, then the subsequently formed refill metal may be too small to reduce the gate resistance.

Figures 22A, 22B:
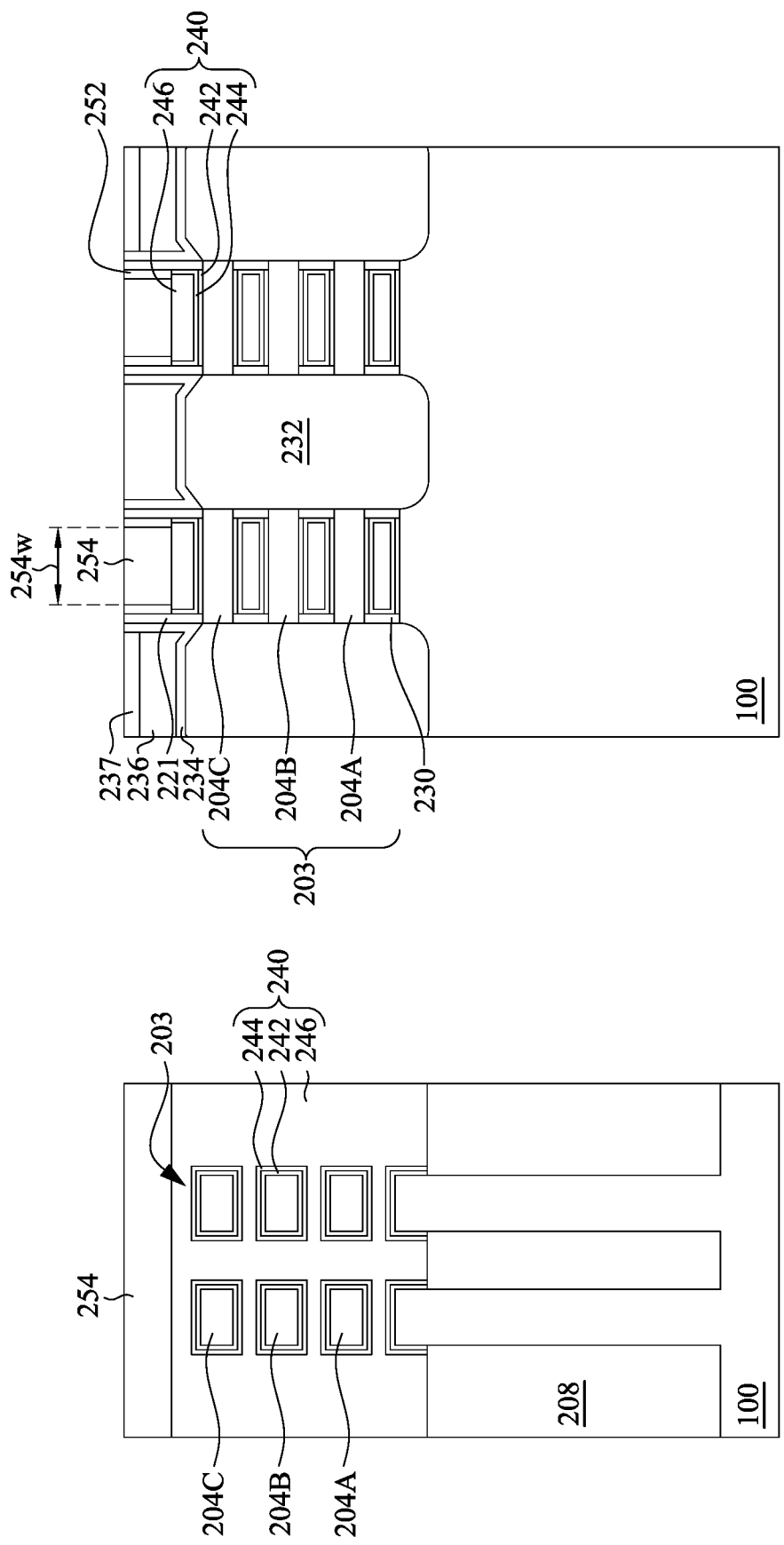

In FIGS. 22A and 22B, gate refill metal structures 254 are formed to fill respective gate trenches 248. The gate refill metal structures 254 can be formed by, for example, depositing a refill metal overfilling the gate trenches 248, followed by performing a planarization process, such as CMP, on the refill metal at least until the protective layer 237 is exposed. Portions of the refill metal remain in the gate trenches 248 once the CMP is completed, and these remaining portions can be referred to as gate refill metal structures 254 that serve to reduce the gate resistance. In some embodiments, the gate refill metal structures 254 are tungsten (W), especially barrier-less or borderless tungsten, which can aid in resistance reduction. In this scenario, opposite sidewalls of the borderless tungsten structure 254 is in contact with corresponding dielectric liners 252 without barrier metals. In some other embodiments, the refill metal structures 254 include, for example, Ru, Co, Cu, Mo, TaN, TiN, Ti, TiAl, the like, or combinations thereof.

As illustrated in FIG. 22B, the gate refill metal structure 254 has a width 254w measured from a first sidewall of the gate refill metal structure 254 to a second sidewall of the gate refill metal structure 254 opposite the first sidewall. In some embodiments, the width 254w of the gate refill metal structure 254 is in a range from about 1 nm to about 30 nm. If the width 254h of the gate refill metal structure 254 is excessively small (e.g., less than about 1 nm), the gate refill metal structure 254 may provide insufficient gate resistance reduction. If the width 254w of the gate refill metal structure 254 is excessively large (e.g., greater than about 30 nm), the isolation breakdown risk between the gate refill metal structure 254 and subsequently formed source/drain contact may be increased. In some embodiments, the gate refill metal structure 254 has a height substantially the same as the height 252h of the dielectric liner 252. Therefore, the height of the gate refill metal structure 254 can be, for example, in a range from about 1 nm to about 30 nm.

FIG. 23 illustrates a top view of the structure as shown in FIGS. 22A and 22B. As illustrated in the top view, the gate refill metal structures 254 form strip-shaped patterns having longitudinal axes substantially perpendicular to longitudinal axes of the nanosheets 204. Moreover, the dielectric liners 252 also form strip-shaped patterns on opposite sides of corresponding gate refill metal structures 254, and the strip-shaped patterns of the dielectric liners 252 have longitudinal axes substantially parallel with the strip-shaped patterns of the gate refill metal structures 254 and substantially perpendicular to longitudinal axes of the nanosheets 204. FIG. 23 further illustrates cut metal gate (CMG) target regions 256 which will be exposed to a subsequent etching step that etches the gate materials (e.g., metals in gate structures 240 and the gate refill metal structures 254) at a faster etch rate than etching the protective layer 237, and thus the etching step can break a continuous gate structure 240 into separate gate structures and break a continuous gate refill metal structure 254 into separate gate refill metal structures, with no or negligible impact on the protective layer 237 and underlying materials. Such etching step can be referred to as a "gate cut" or "cut metal gate" step.

Figure 24C:
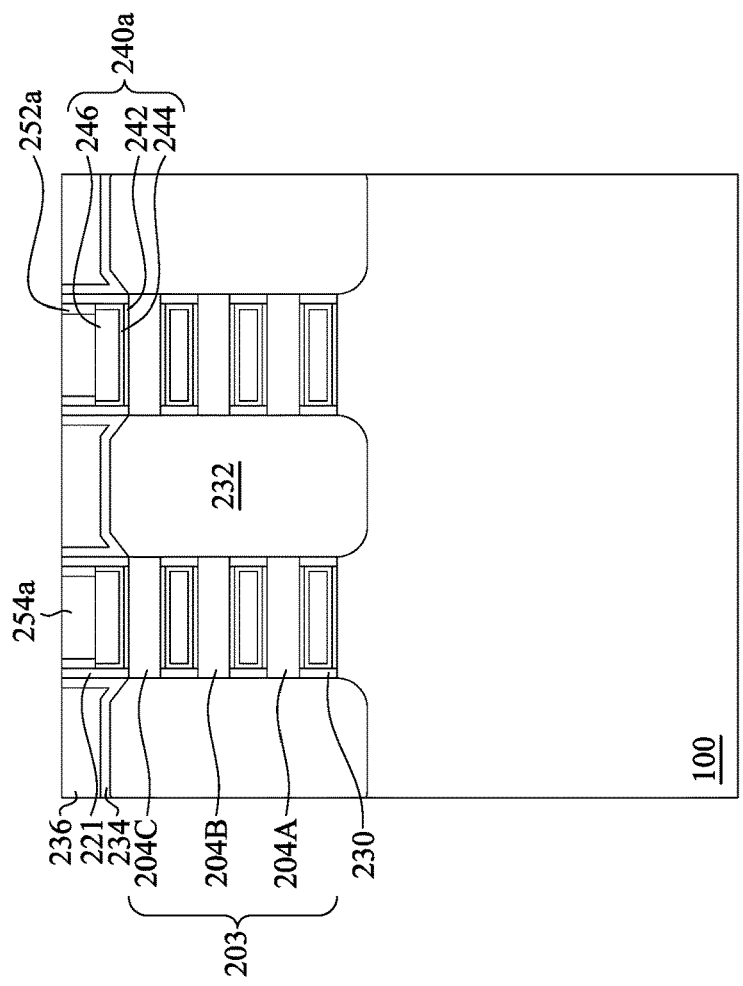
Figure 24B:
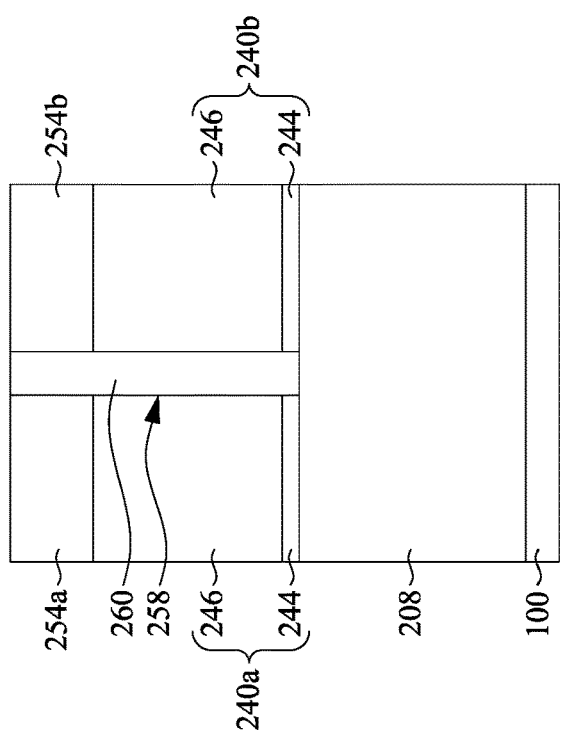
FIG. 24B illustrates reference cross-section D-D' illustrated in FIG. 24A.

FIGS. 24A-24C illustrates the gate cut step (i.e., cut metal gate step). In this step, a patterned mask (e.g., patterned photoresist) is first formed over the substrate 100, except for the CMG target regions 256 as illustrated in FIG. 23, and then one or more etching processes are performed on the exposed CMG target regions 256 to form gate cut openings 258 each breaking a continuous gate structure 240 into separate gate structures 240a, 240b and breaking a continuous gate refill metal structure 254 into separate gate refill metal structures 254a, 254b. Afterwards, gate isolation structures 260 are formed in the gate cut openings 258, so as to electrically isolate the separate gate structures 240a, 240b, and the gate refill metal structures 254a, 254b. Formation of the isolation structures 260 includes, for example, depositing a dielectric material overfilling the gate cut openings 258, followed by performing a planarization step (e.g., CMP) to remove excess dielectric material outside the gate cut openings 258. In some embodiments, the CMP also removes the protective layer 237 such that the ILD layer 236 is exposed, as illustrated in FIG. 24C.

As illustrated in FIG. 24A, in some embodiments, the one or more etching processes for forming the gate cut openings 258 further break a continuous dielectric liner 252 into separate dielectric liners 252a, 252b. Once formation of the gate isolation structure 260 is complete, the gate isolation structure 260 is disposed between the dielectric liners 252a, 252b. In particular, the gate isolation structure 260 has opposite sidewalls respectively in contact with the dielectric liners 252a, 252b.

Figure 25A:
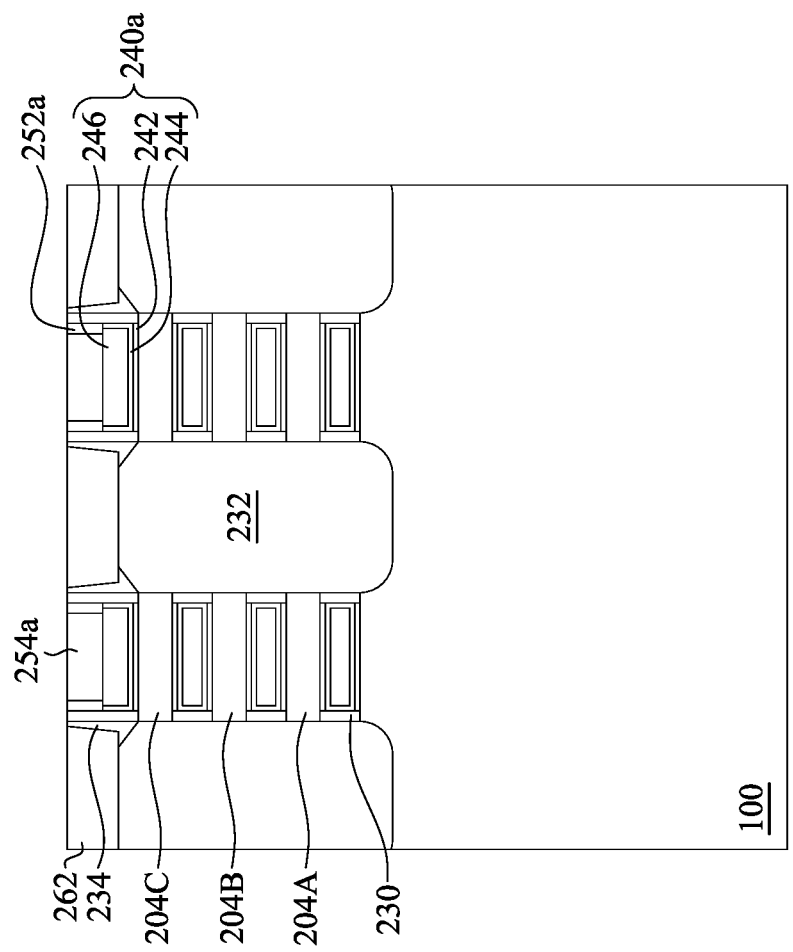

In FIG. 25A, source/drain contacts 262 are formed extending through the CESL 234 and the ILD layer 236. Formation of the source/drain contacts 262 includes, by way of example and not limitation, performing one or more etching processes to form contact openings extending though the ILD layer 236 and the CESL 234 to expose the source/drain epitaxy structures 232, depositing one or more metal materials (e.g., W, Ru, Co, Cu, Ti, TiN, Ta, TaN, Mo, Ni, the like or combinations thereof) overfilling the contact openings, and then performing a CMP process to remove excessive metal materials outside the contact openings. FIG.

Figure 25B:
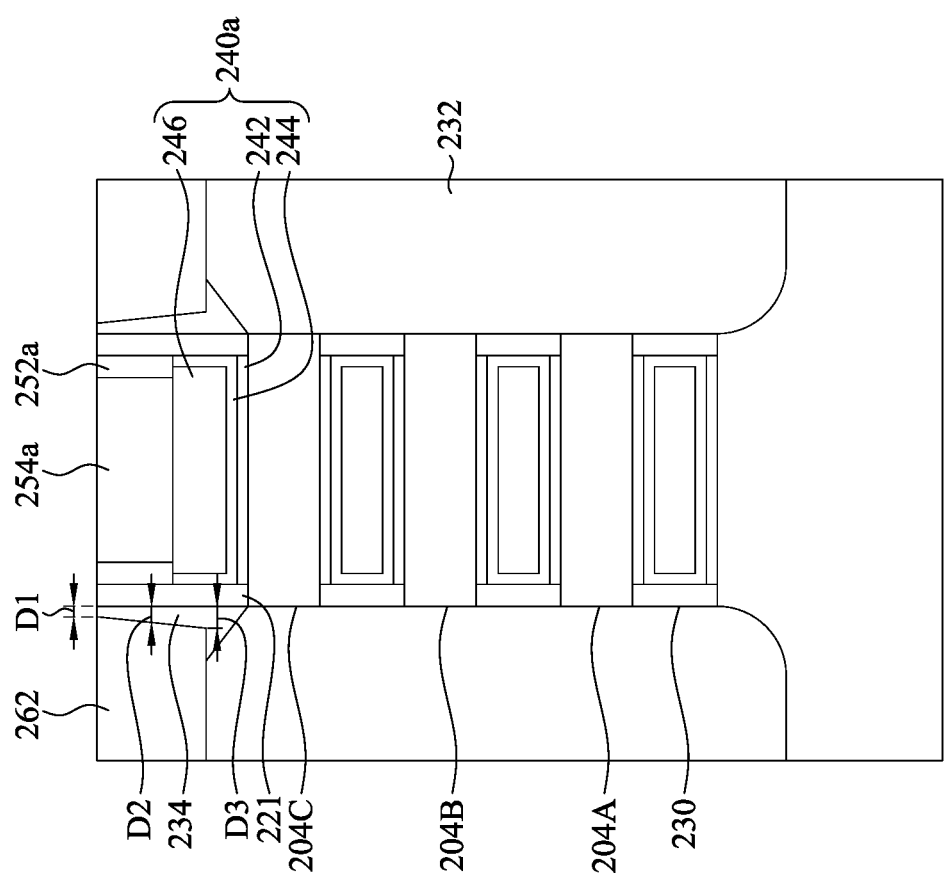
FIG. 25B is a zoomed-in cross-sectional view of the structure shown in FIG. 25A.

25B is a zoomed-in view of the structure shown in FIG. 25A. As illustrated in FIG. 25B, the source/drain contact 262 has an inverted trapezoidal cross-section, and a lateral distance from the source/drain contact 262 to the gate spacer 221 increases from top of the source/drain contact 22 to bottom of the source/drain contact. For example, the lateral distance D1 from the source/drain contact 262 to the gate spacer 221 at the top of the source/drain contact 262 is in a range from about 1 nm to about 15 nm, the lateral distance D2 from the source/drain contact 262 to the gate spacer 221 at the bottom of the dielectric liner 252a is in a range from about 1 nm to about 15 nm, and the lateral distance D3 from the source/drain contact 262 to the gate spacer 221 at the bottom of the source/drain contact 262 is in a range from about 1 nm to about 15 nm, wherein the distance D1 is smaller than the distance D2, and the distance D2 is smaller than the distance D3 if the source/drain contact 262 has an inverted trapezoidal cross-section.

Based on the above discussions, it can be seen that the present disclosure in various embodiments offers advantages. It is understood, however, that other embodiments may offer additional advantages, and not all advantages are necessarily disclosed herein, and that no particular advantage is required for all embodiments. One advantage is that a distance from the gate refill metal to the source/drain contact can be increased by a dielectric liner, which in turn reduces risk of isolation breakdown between the gate structure and the source/drain contact.

In some embodiments, a method includes forming gate spacers on a substrate; forming source/drain regions on the substrate, the gate spacers being between the source/drain regions; forming a gate structure between gate spacers; etching back the gate structure to form a trench between the gate spacers; forming dielectric liners lining sidewalls of the trench between the gate spacers; forming a refill metal structure on the etched-back gate structure and between the dielectric liners; and forming source/drain contacts on the source/drain regions.

In some embodiments, a method includes forming source/drain regions on a substrate; forming a gate structure between the source/drain regions, with gate spacers on opposite sidewalls of the gate structure; lowering a top surface of the gate structure to below top surfaces of the gate spacers; forming dielectric liners on first regions of the lowered top surface of the gate structure; forming a refill metal structure on a second region of the lowered top surface of the gate structure and between the dielectric liners; and forming source/drain contacts on the source/drain regions.

In some embodiments, a device includes a gate structure, first and second gate spacers, source/drain regions, a refill metal structure, and a first dielectric liner. The gate structure is on a substrate. The first and second gate spacers are on opposite sides of the gate structure, respectively. The source/drain regions are spaced part from the gate structure at least in part by the first and second gate spacers. The refill metal structure is on the gate structure and between the first and second gate spacers. The first dielectric liner is atop the gate structure. The first dielectric liner interposes the refill metal structure and the first gate spacer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming gate spacers on a substrate;
    forming source/drain regions on the substrate, the gate spacers being between the source/drain regions;
    forming a gate structure between gate spacers;
    etching back the gate structure to form a trench between the gate spacers;
    forming dielectric liners lining sidewalls of the trench between the gate spacers;
    forming a refill metal structure on the etched-back gate structure and between the dielectric liners; and
    forming source/drain contacts on the source/drain regions.

2. The method of claim 1, wherein forming the dielectric liners comprises:
    depositing a dielectric layer in the trench between the gate spacers; and
    removing a horizontal portion of the dielectric layer from the trench between the gate spacers, while leaving vertical portions of the dielectric layer in the trench between the gate spacers.

3. The method of claim 2, wherein removing the horizontal portion of the dielectric layer is performed using anisotropic etching.

4. The method of claim 1, wherein the dielectric liners have a dielectric constant greater than a dielectric constant of the gate spacers.

5. The method of claim 1, wherein the refill metal structure is a borderless structure.

6. The method of claim 1, wherein the refill metal structure is tungsten in contact with the dielectric liners.

7. The method of claim 1, wherein forming the refill metal structure comprises:
    depositing a metal in the trench between the gate spacers after forming the dielectric liners lining the sidewalls of the trench between the gate spacers; and
    performing a chemical-mechanical polish (CMP) process on the metal, wherein after the CMP process is complete, the dielectric liners are exposed.

8. The method of claim 1, further comprising:
    performing an etching process to break the refill metal structure into separate first and second refill metal structures and break the gate structure into separate first and second gate structures.

9. The method of claim 8, wherein the etching process further breaks one of the dielectric liners into separate first and second dielectric liners.

10. A method comprising:
    forming source/drain regions on a substrate;
    forming a gate structure between the source/drain regions, with gate spacers on opposite sidewalls of the gate structure;
    lowering a top surface of the gate structure to below top surfaces of the gate spacers;
    forming dielectric liners on first regions of the lowered top surface of the gate structure;
    forming a refill metal structure on a second region of the lowered top surface of the gate structure and between the dielectric liners; and
    forming source/drain contacts on the source/drain regions.

11. The method of claim 10, wherein the refill metal structure is formed after forming the dielectric liners on the first regions of the lowered top surface of the gate structure.

12. The method of claim 10, wherein forming the dielectric liners comprises:
   depositing a dielectric layer over the lowered top surface of the gate structure; and
   removing a portion of the dielectric layer from the second region of the lowered top surface of the gate structure.

13. The method of claim 12, wherein the portion of the dielectric layer is removed by using anisotropic etching.

14. The method of claim 10, wherein the source/drain contacts are formed after forming the refill metal structure.

15. The method of claim 10, further comprising:
   performing an etching process to form an opening breaking the refill metal structure into separate first and second refill metal structures and breaking the gate structure into separate first and second gate structures; and
   forming an isolation structure in the opening.

16. The method of claim 15, wherein the etching process is performed such that the opening further breaks one of the dielectric liners into separate first and second dielectric liners, and the isolation structure is formed such that opposite sidewalls of the isolation structure are respectively in contact with the first and second dielectric liners.

17. A device comprising:
   a gate structure on a substrate;
   a first gate spacer and a second gate spacer on opposite sides of the gate structure, respectively;
   source/drain regions spaced part from the gate structure at least in part by the first and second gate spacers;
   a refill metal structure on the gate structure and between the first and second gate spacers; and
   a first dielectric liner atop the gate structure, the first dielectric liner interposing the refill metal structure and the first gate spacer.

18. The device of claim 17, wherein the first dielectric liner has a smaller height than the first gate spacer.

19. The device of claim 17, further comprising:
   a second dielectric liner interposing the refill metal structure and the second gate spacer.

20. The device of claim 19, wherein the second dielectric liner has a smaller height than the second gate spacer.

* * * * *